United States Patent
Park et al.

(10) Patent No.: US 11,502,130 B2
(45) Date of Patent: Nov. 15, 2022

(54) VARIABLE RESISTANCE MEMORY DEVICE AND METHOD OF FABRICATING THE SAME

(71) Applicant: SAMSUNG ELECTRONICS CO., LTD., Suwon-si (KR)

(72) Inventors: Kyusul Park, Suwon-si (KR); Woohyun Park, Seoul (KR); Ilmok Park, Seoul (KR); Seulji Song, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 210 days.

(21) Appl. No.: 16/937,963

(22) Filed: Jul. 24, 2020

(65) Prior Publication Data
US 2021/0167130 A1    Jun. 3, 2021

(30) Foreign Application Priority Data
Dec. 2, 2019 (KR) ........................ 10-2019-0158221

(51) Int. Cl.
*H01L 27/24* (2006.01)
*H01L 45/00* (2006.01)

(52) U.S. Cl.
CPC ...... *H01L 27/2472* (2013.01); *H01L 45/1253* (2013.01); *H01L 45/145* (2013.01); *H01L 45/1691* (2013.01)

(58) Field of Classification Search
CPC ............................ H01L 27/24; H01L 27/2481
See application file for complete search history.

(56) References Cited

U.S. PATENT DOCUMENTS

| | | | |
|---|---|---|---|
| 7,838,860 B2 | 11/2010 | Happ et al. | |
| 9,601,693 B1 | 3/2017 | Henri et al. | |
| 9,691,475 B2 | 6/2017 | Redaelli | |
| 9,698,346 B2 | 7/2017 | Boniardi et al. | |
| 9,806,129 B2 | 10/2017 | Ravasio et al. | |
| 10,128,437 B1 | 11/2018 | Fantini et al. | |
| 10,249,819 B2 | 4/2019 | Campbell et al. | |
| 10,879,461 B2 * | 12/2020 | Kim .................... | H01L 27/2409 |
| 2021/0028360 A1 | 1/2021 | Kim et al. | |
| 2021/0104671 A1 | 4/2021 | Song et al. | |

FOREIGN PATENT DOCUMENTS

KR    10-2021-0012079 A    2/2021
KR    10-2021-0041692 A    4/2021

* cited by examiner

*Primary Examiner* — Mark V Prenty
(74) *Attorney, Agent, or Firm* — Lee IP Law, P.C.

(57) ABSTRACT

A variable resistance memory device and a method of fabricating a variable resistance memory device, the device including first conductive lines extending in a first direction; second conductive lines extending in a second direction crossing the first direction; and memory cells at respective intersection points of the first conductive lines and the second conductive lines, wherein each of the memory cells includes a switching pattern, an intermediate electrode, a variable resistance pattern, and an upper electrode, which are between the first and second conductive lines and are connected in series; and a spacer structure including a first spacer and a second spacer, the first spacer being on a side surface of the upper electrode, and the second spacer covering the first spacer and a side surface of the variable resistance pattern such that the second spacer is in contact with the side surface of the variable resistance pattern.

17 Claims, 22 Drawing Sheets

VARIABLE RESISTANCE MEMORY DEVICE AND METHOD OF FABRICATING THE SAME

CROSS-REFERENCE TO RELATED APPLICATION

Korean Patent Application No. 10-2019-0158221, filed on Dec. 2, 2019, in the Korean Intellectual Property Office, and entitled: "Variable Resistance Memory Device and Method of Fabricating the Same," is incorporated by reference herein in its entirety.

BACKGROUND

1. Field

Embodiments relate to a variable resistance memory device and a method of fabricating the same.

2. Description of the Related Art

Semiconductor devices may include memory devices and logic devices. The memory devices may be used to store data. The memory devices may include volatile memory devices and nonvolatile memory devices. The volatile memory devices lose their stored data when their power supply is interrupted, whereas the nonvolatile memory devices retain their data even when their power supply is interrupted.

To meet the recent demand for semiconductor memory devices with high performance and low power consumption, next-generation semiconductor memory devices, e.g. a ferroelectric random access memory (FRAM), a magnetic random access memory (MRAM) and a phase-change random access memory (PRAM), have been considered. A material or structure of a next-generation semiconductor memory device may be a variable resistance and nonvolatile property that is changed by a current or voltage forced or applied thereto, and is not changed even when a current or voltage supply is interrupted.

SUMMARY

The embodiments may be realized by providing a variable resistance memory device including first conductive lines extending in a first direction; second conductive lines extending in a second direction crossing the first direction; and memory cells at respective intersection points of the first conductive lines and the second conductive lines, wherein each of the memory cells includes a switching pattern, an intermediate electrode, a variable resistance pattern, and an upper electrode, which are between the first and second conductive lines and are connected in series; and a spacer structure including a first spacer and a second spacer, the first spacer being on a side surface of the upper electrode, and the second spacer covering the first spacer and a side surface of the variable resistance pattern such that the second spacer is in contact with the side surface of the variable resistance pattern.

The embodiments may be realized by providing a variable resistance memory device including memory cells two-dimensionally arranged on a substrate, and an insulating layer filling a space between the memory cells, wherein each of the memory cells includes a lower electrode; a switching pattern on the lower electrode; an intermediate electrode on the switching pattern; a lower metal pattern on the intermediate electrode; a variable resistance pattern on the lower metal pattern; an upper electrode on the variable resistance pattern; a second spacer covering a side surface of the upper electrode and a side surface of the variable resistance pattern; and a first spacer between the upper electrode and the second spacer, the first spacer being in contact with a portion of a top surface of the variable resistance pattern protruding outwardly relative to the side surface of the upper electrode.

The embodiments may be realized by providing a method of fabricating a variable resistance memory device, the method including sequentially stacking a first conductive layer, a switch layer, a second conductive layer, a variable resistance layer, and a third conductive layer; performing a first patterning process on the third conductive layer to form an upper electrode; performing a cleaning process to remove an impurity layer from a side surface of the upper electrode; forming a first spacer on the side surface of the upper electrode and on a top surface of the variable resistance layer exposed by the upper electrode; performing a second patterning process on a bottom portion of the first spacer, which is positioned on the top surface of the variable resistance layer, and the variable resistance layer to form a variable resistance pattern, the first spacer being left on the side surface of the upper electrode, after the second patterning process; forming a second spacer on an outer side surface of the first spacer and a side surface of the variable resistance pattern; performing a third patterning process on the second conductive layer, the switch layer, and the first conductive layer to form an intermediate electrode, a switching pattern, and a lower electrode; and forming an insulating layer to surround a stack of the lower electrode, the switching pattern, the intermediate electrode, the variable resistance pattern, and the upper electrode.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
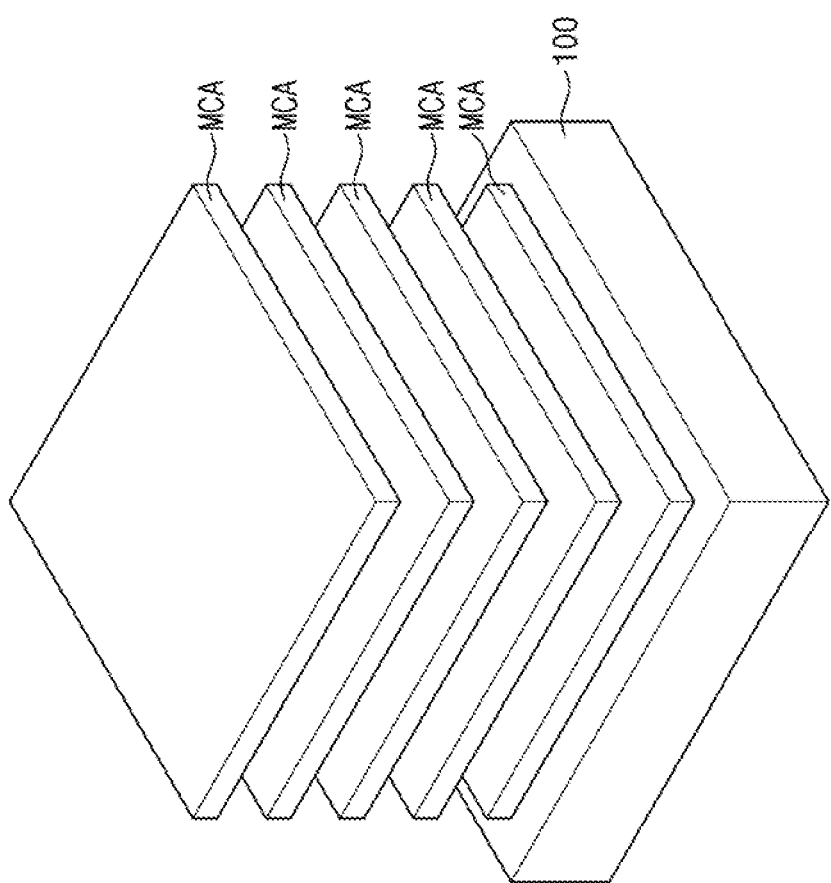
FIG. 1 is a conceptual diagram of a variable resistance memory device according to an embodiment.

FIG. 1 is a conceptual diagram of a variable resistance memory device according to an embodiment.

Referring to FIG. 1, a variable resistance memory device may include a plurality of memory cell stacks MCA sequentially stacked on a substrate 100. Each of the memory cell stacks MCA may include a plurality of memory cells, which are two-dimensionally arranged. The variable resistance memory device may include a plurality of conductive lines, which are between the memory cell stacks MCA and are used to execute read, write, and/or erase operations on the memory cells. In an implementation, as illustrated in FIG. 1, five memory cell stacks MCA may be provided, or other numbers of memory cell stacks MCA may be provided.

Figure 2:
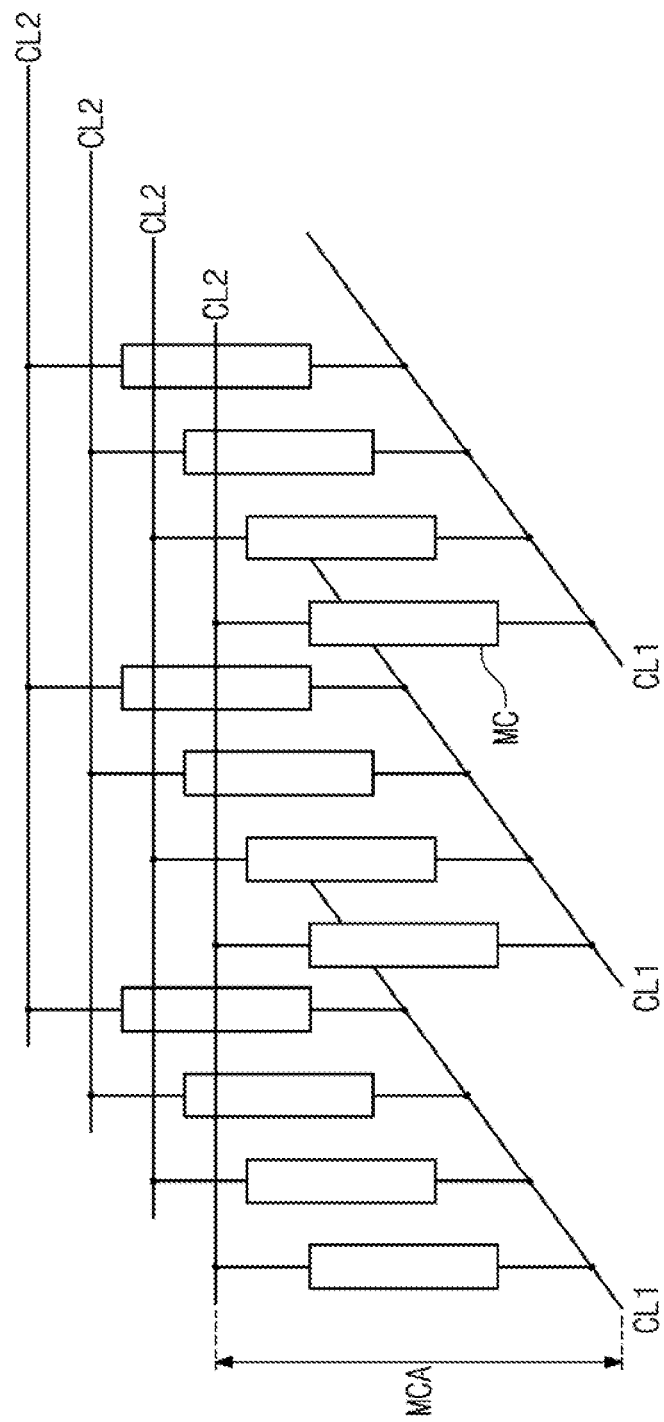
FIG. 2 is a circuit diagram of memory cell stacks of FIG. 1.

FIG. 2 is a circuit diagram of the memory cell stacks of FIG. 1.

Referring to FIGS. 1 and 2, the memory cell stack MCA may include memory cells MC, each of which is provided at a corresponding one of intersection points of first conductive lines CL1 and second conductive lines CL2. FIG. 2 illustrates just one memory cell stack MCA, and another memory cell stack MCA, which has the same or similar structure as that of FIG. 2, may be provided on the memory cell stack MCA. Here, adjacent ones of the memory cell stacks MCA may have conductive lines therebetween or may have separate conductive lines.

The memory cells MC constituting the memory cell stack MCA may be arranged on the substrate 100 to form a plurality of rows and a plurality of columns (e.g., in a two-dimensionally array shape). Each of the memory cells MC may include a switching pattern and a variable resistance pattern. In each of the memory cells MC, the switching pattern and the variable resistance pattern may be connected in series between one first conductive line CL1 and one second conductive line CL2.

The switching pattern may be provided at each of the intersection points of the first conductive lines CL1 and the second conductive lines CL2 and may be physically spaced apart from other switching patterns provided at neighboring intersection points. The variable resistance pattern may be provided at each of intersection points of the first conductive lines CL1 and the second conductive lines CL2 and may be physically spaced apart from other variable resistance patterns provided at neighboring intersection points. In an embodiment, a single pattern, which is composed of a plurality of physically-connected variable resistance patterns, may be shared by the memory cells MC. In an implementation, when viewed in a plan view, the variable resistance pattern may be a line-shaped pattern, which is elongated in an extension direction of the first or second conductive line CL1 or CL2.

In an implementation, the second conductive lines CL2 may be shared by the memory cell stack MCA and another memory cell stack MCA placed thereon. In an implementation, the memory cell stacks MCA may not share the conductive lines, and each of the memory cell stacks MCA may be configured to have its own first and second conductive lines CL1 and CL2.

Figure 3:
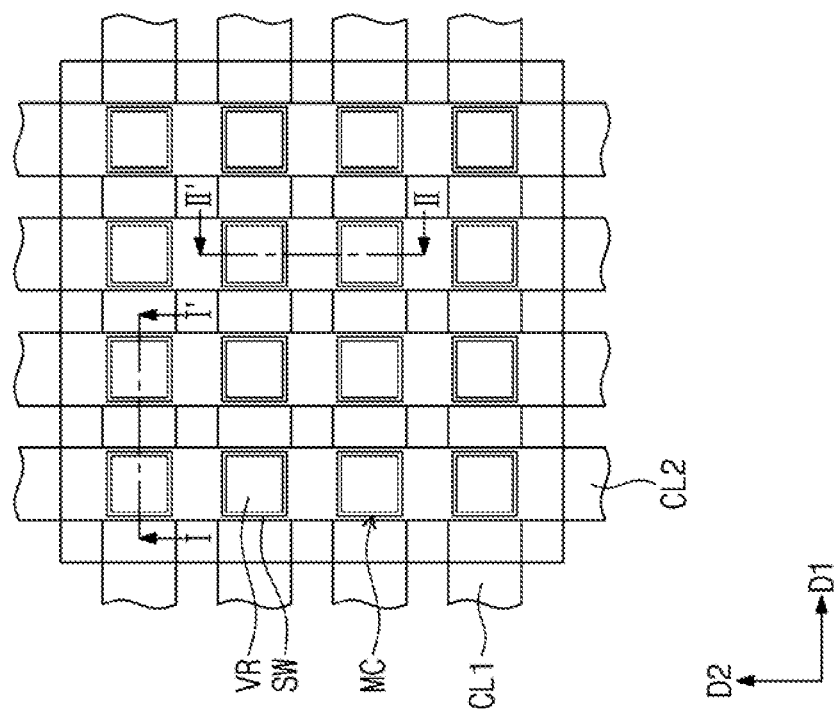
FIG. 3 is a plan view of a variable resistance memory device according to an embodiment.
Figure 4:
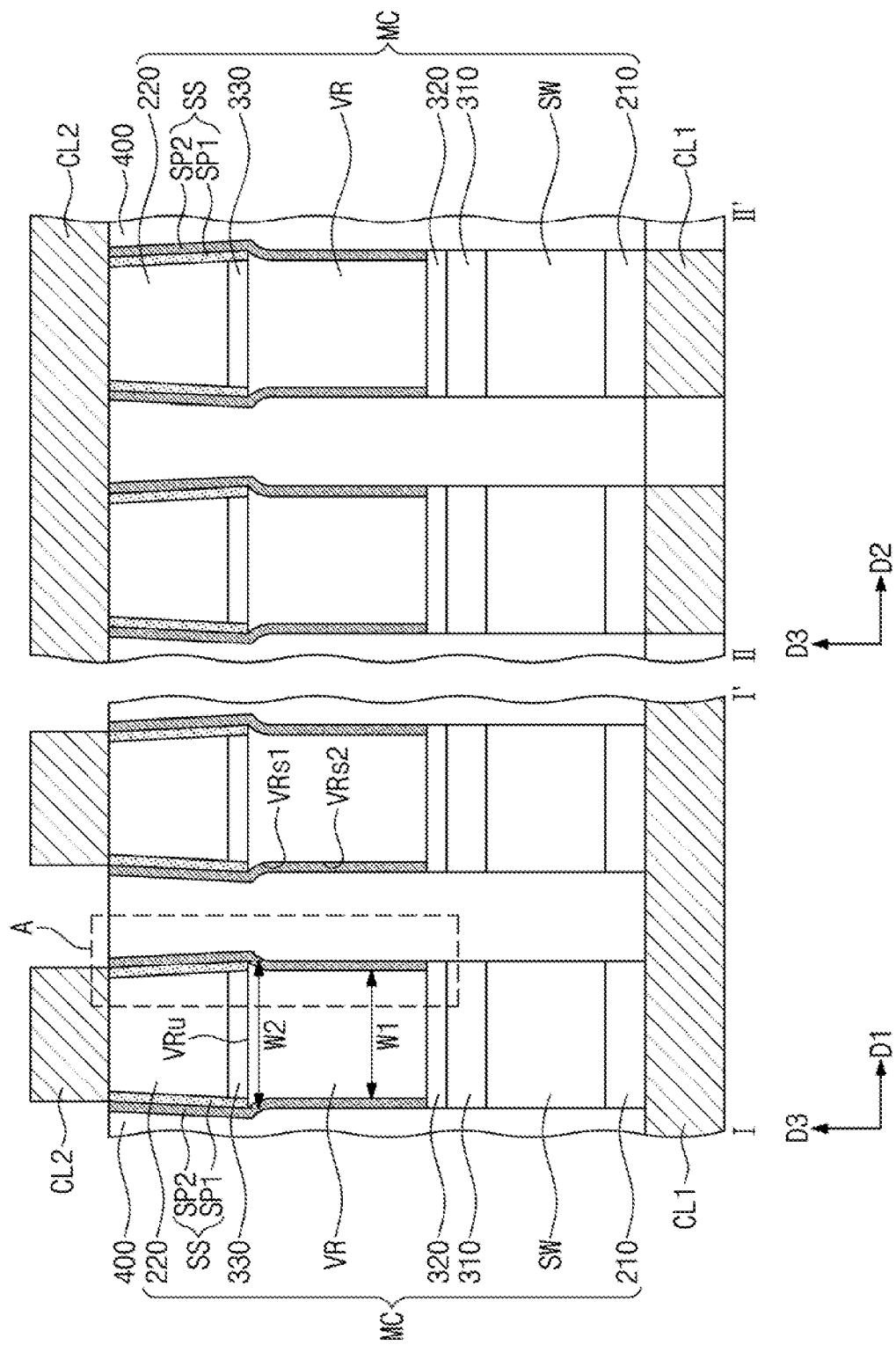
FIG. 4 is a sectional view of sections taken along line lines I-I' and II-II' of FIG. 3.
Figure 5:
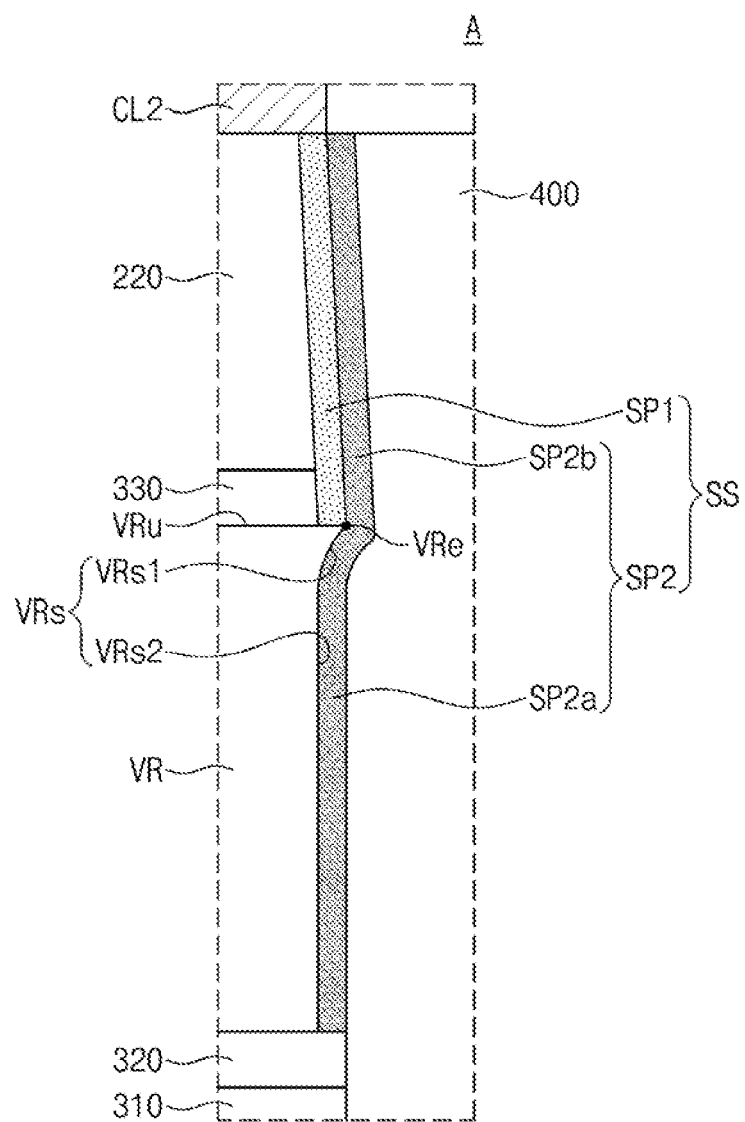
FIGS. 5 and 6 are enlarged views of a portion 'A' of FIG. 3.
Figure 6:
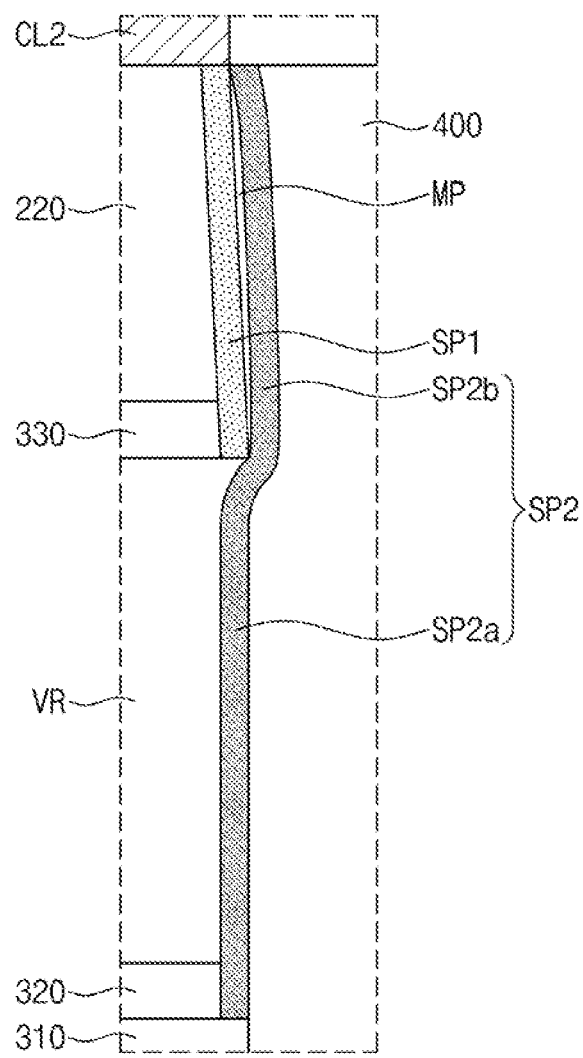

FIG. 3 is a plan view of a variable resistance memory device according to an embodiment. FIG. 4 is a sectional view of sections taken along line lines I-I' and II-II' of FIG. 3. FIGS. 5 and 6 are enlarged views of a portion 'A' of FIG. 3. For convenience in illustration, some elements of the variable resistance memory device may not be illustrated in FIGS. 2 to 6.

Referring to FIGS. 2 and 3, the first conductive lines CL1 and the second conductive lines CL2 may be provided on a substrate. The first conductive lines CL1 may extend (e.g., lengthwise) in a first direction D1 and may be spaced apart from each other in a second direction D2. In an implementation, the first conductive lines CL1 may be word lines of the variable resistance memory device. The second conductive lines CL2 may be spaced apart from the first conductive lines CL1 in a third direction D3, which is perpendicular to both of the first and second directions D1 and D2. The second conductive lines CL2 may extend in the second direction D2 and may be spaced apart from each other in the first direction D1. In an implementation, the second conductive lines CL2 may be used as bit lines of the variable resistance memory device. The first conductive lines CL1 and the second conductive lines CL2 may be formed of or include a metal (e.g., copper (Cu), tungsten (W), aluminum (Al), or the like) or a metal nitride (e.g., tantalum nitride (TaN), titanium nitride (TiN), tungsten nitride (WN), or the like). As used herein, the term "or" is not an exclusive term, e.g., "A or B" would include A, B, or A and B. An interconnection insulating layer 410 may be provided to fill a space between the first conductive lines CL1. The interconnection insulating layer 410 may be formed of or include silicon oxide or silicon nitride.

The memory cell stack MCA described with reference to FIG. 2 may be provided between the first conductive lines CL1 and the second conductive lines CL2. The memory cell stack MCA may include the memory cells MC, which are provided at respective intersection points between the first conductive lines CL1 and the second conductive lines CL2. The memory cells MC may be two-dimensionally arranged in the first and second directions D1 and D2. For convenience in illustration, only one of the memory cell stacks MCA is illustrated, but in an embodiment, a plurality of memory cell stacks may be stacked on the substrate in the third direction D3. In this case, structures, each of which is composed of the memory cell stack MCA, the first conductive lines CL1, and the second conductive lines CL2, may be alternately and repeatedly provided on the substrate.

The memory cells MC may be electrically connected to the first conductive lines CL1 and the second conductive lines CL2 through lower electrodes 210 and upper electrodes 220. In an implementation, each of the lower electrodes 210 may be below a corresponding one of the memory cells MC (e.g., between the memory cell MC and the first conductive line CL1) to electrically connect the memory cell MC to the first conductive line CL1. Each of the upper electrodes 220 may be on a corresponding one of the memory cells MC to electrically connect the memory cell MC to the second conductive line CL2. In an implementation, the lower electrodes 210 and the upper electrodes 220 may each be formed of or include a carbon-containing material. In an implementation, the lower electrodes 210 and the upper electrodes 220 may each be formed of or include a metal (e.g., tungsten (W), titanium (Ti), aluminum (Al), or copper (Cu)) or a metal nitride. A width (e.g., as measured in the first direction D1 or the second direction D2) of each of the lower electrodes 210 may be smaller than or substantially equal to a width of the first conductive line CL1 thereunder.

Each of the memory cells MC may include, e.g., a switching pattern SW, an intermediate electrode 310, a lower metal pattern 320, a variable resistance pattern VR, an upper metal pattern 330, and an upper electrode 220. In each of the memory cells MC, the switching pattern SW, the intermediate electrode 310, the lower metal pattern 320, the variable resistance pattern VR, the upper metal pattern 330, and the upper electrode 220 may be connected in series between a pair of the first and second conductive lines CL1 and CL2 coupled thereto. In an implementation, as illustrated in FIGS. 3 and 4, the variable resistance pattern VR may be on the switching pattern SW (e.g., such that the switching pattern SW is between the variable resistance pattern VR and the first conductive line CL1). In an implementation, the switching pattern SW may be on the variable resistance pattern VR (e.g., such that the variable resistance pattern VR is between the switching pattern SW and the first conductive line CL1).

The variable resistance pattern VR may be formed of or include a material in which information can be stored. In an implementation, the variable resistance pattern VR may be formed of or include a material whose crystalline structure may be be changed to one of crystalline and amorphous structures, depending on its temperature. The variable resistance pattern VR may have a phase transition temperature of about 250° C. to 350° C., at which its phase is changed from the crystalline structure to the amorphous structure or vice versa. In an implementation, the variable resistance pattern VR may include a compound, in which a chalcogen element (e.g., Te or Se) and Ge, Sb, Bi, Pb, Sn, Ag, As, S, Si, In, Ti, Ga, P, O, or C are contained. In an implementation, the variable resistance pattern VR may be formed of or include GeSbTe, GeTeAs, SbTeSe, GeTe, SbTe, SeTeSn, GeTeSe, SbSeBi, GeBiTe, GeTeTi, InSe, GaTeSe, or InSbTe. In an implementation, the variable resistance pattern VR may have a super lattice structure, in which a germanium-containing layer (e.g., GeTe layer) and a germanium-free layer (e.g., SbTe layer) are repeatedly stacked.

In an implementation, the variable resistance pattern VR may be formed of or include a perovskite compound or a conductive metal oxide. In an implementation, the variable resistance pattern VR may be formed of or include niobium oxide, titanium oxide, nickel oxide, zirconium oxide, vanadium oxide, PCMO ((Pr, Ca)MnO$_3$), strontium-titanium oxide, barium-strontium-titanium oxide, strontium-zirconium oxide, barium-zirconium oxide, or barium-strontium-zirconium oxide. In an implementation, the variable resistance pattern VR may have a double-layered structure including a conductive metal oxide layer and a tunnel insulating layer or a triple-layered structure including a first conductive metal oxide layer, a tunnel insulating layer, and a second conductive metal oxide layer. In an implementation, the tunnel insulating layer may be formed of or include aluminum oxide, hafnium oxide, or silicon oxide.

The switching pattern SW may be configured to have a non-linear (e.g., S-shaped) I-V curve and, in this case, it may be operated, based on a threshold switching phenomenon. In an implementation, the switching pattern SW may be or include an ovonic threshold switch (OTS) device having bi-directional switching characteristics. The switching pattern SW may have a phase transition temperature that is higher than that of the variable resistance pattern VR. In an implementation, the phase transition temperature of the switching pattern SW may range from about 350° C. to about 450° C. Accordingly, during the operation of the variable resistance memory device, the structure or phase of the variable resistance pattern VR may be reversibly changed from the crystalline structure to the amorphous structure or vice versa, but the structure or phase of the switching pattern SW may be maintained to its initial state (e.g., an amorphous state), without any change. In the present specification, the expression "substantially amorphous state" is not used to exclude a crystalline structure, in which crystalline grains locally or locally-crystallized portions exists. In an implementation, the switching pattern SW may be formed of a compound containing a chalcogenide element (e.g., Te or Se) and Ge, Sb, Bi, Al, Pb, Sn, Ag, As, S, Si, In, Ti, Ga, or P. The switching pattern SW may further contain a thermal stabilization element. The thermal stabilization element may include C, N, or O. In an implementation, the switching pattern SW may be formed of or include AsTe, AsSe, GeTe, SnTe, GeSe, SnTe, SnSe, ZnTe, AsTeSe, AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe, GeBiTeSe, GeAsSbSe, GeAsBiTe, or GeAsBiSe.

The switching pattern SW and the variable resistance pattern VR may be electrically connected to each other through the intermediate electrode 310 therebetween. In an implementation, the intermediate electrode 310 may be formed of or include a carbon-containing material. In an implementation, the intermediate electrode 310 may be formed of or include a metal (e.g., tungsten (W), titanium (Ti), aluminum (Al), or copper (Cu)) or a metal nitride.

The lower metal pattern 320 and the upper metal pattern 330 may be at opposite ends of the variable resistance pattern VR. In an implementation, the lower metal pattern 320 may be between the intermediate electrode 310 and the variable resistance pattern VR, and the upper metal pattern 330 may be between the variable resistance pattern VR and the upper electrode 220. The lower metal pattern 320 may be in contact (e.g., direct contact) with a bottom surface of the variable resistance pattern VR, and the upper metal pattern 330 may be in contact (e.g., direct contact) with a top surface of the variable resistance pattern VR. The lower metal pattern 320 and the upper metal pattern 330 may help prevent a material from being diffused from one of the variable resistance pattern VR, the upper electrode 220, and the intermediate electrode 310 to another pattern or electrode. In an implementation, the lower metal pattern 320 and the upper metal pattern 330 may be formed of or include, e.g., W, Ti, Al, Cu, C, CN, TiN, TiAlN, TiSiN, TiCN, WN, CoSiN, WSiN, TaN, TaCN, or TaSiN. In an implementation, at least one of the lower and upper metal patterns 320 and 330 may be omitted.

In each of the memory cells MC, the lower electrode 210, the switching pattern SW, the intermediate electrode 310, and the lower metal pattern 320 may have the same width (e.g., as measured in the first direction D1 or the second direction D2). In an implementation, a side surface of the lower electrode 210, a side surface of the switching pattern SW, a side surface of the intermediate electrode 310, and a side surface of the lower metal pattern 320 may be aligned to each other (e.g., may be coplanar). In an implementation, the upper metal pattern 330 and the upper electrode 220 may have the same width. In an implementation, a side surface of the upper metal pattern 330 may be aligned to a side surface of the upper electrode 220. The widths of the upper metal pattern 330 and the upper electrode 220 may be equal to or smaller than the widths of the lower electrode 210, the switching pattern SW, the intermediate electrode 310, and the lower metal pattern 320.

A width W1 of the variable resistance pattern VR (measured in the first direction D1 at a level of an interface between the lower metal pattern 320 and the variable resistance pattern VR) may be smaller than the width of the lower metal pattern 320 (as measured in the first direction D1). A portion of a top surface of the lower metal pattern 320 may not be veiled by, covered by, or in contact with the variable resistance pattern VR.

A width W2 of the variable resistance pattern VR (measured in the first direction D1 at a level of an interface between the variable resistance pattern VR and the upper metal pattern 330) may be larger than the width of the upper metal pattern 330 (as measured in the first direction D1). In an implementation, a width of a top surface VRu (e.g., surface that faces away from the first conductive line CL1 in the third direction D3) of the variable resistance pattern VR (e.g., a width of the variable resistance pattern VR at the top surface VRu thereof) may be larger than a width of a bottom surface (e.g., first conductive line CL1-facing surface) of the upper metal pattern 330. In an implementation, a part of an upper portion (e.g., distal to the first conductive line CL1 in the third direction D3) of the variable resistance pattern VR may protrude from the side surface of the upper metal pattern 330 (e.g., may protrude outwardly in the first direction D1 or second direction D2 beyond an outer side surface of the upper metal pattern 330). A portion of the top surface VRu of the variable resistance pattern VR may not be veiled by, covered by, or in contact with the upper metal pattern 330.

The variable resistance pattern VR may have a horizontal width (e.g., as measured in the first direction D1 or the second direction D2) that decreases in a direction (e.g., the third direction D3) from the upper metal pattern 330 toward the lower metal pattern 320. In an implementation, a side surface VRs1 of the upper portion of the variable resistance pattern VR may be a curved (e.g., concave) surface. In an implementation, a lower portion of the variable resistance pattern VR may have a uniform width (e.g., W1), and a side surface VRs2 of the lower portion of the variable resistance pattern VR may be flat at least when viewed in a sectional view. In an implementation, the portion of the variable resistance pattern VR that has the decreasing width in the third direction D3 may be distal to the lower metal pattern 320 (in the third direction D3), and the portion of the variable resistance pattern VR proximate to the lower metal pattern 320 (in the third direction D3) may have a uniform width.

The memory cell MC may further include a spacer structure SS. The spacer structure SS may cover the side surfaces of the variable resistance pattern VR, the upper metal pattern 330, and the upper electrode 220. The spacer structure SS may include a first spacer SP1 and a second spacer SP2. Hereinafter, the spacer structure SS will be described in more detail.

Referring to FIG. 5, the first spacer SP1 of the spacer structure SS may cover the side surface of the upper metal pattern 330 and the side surface of the upper electrode 220. The first spacer SP1 may be in contact (e.g., direct contact) with the side surface of the upper metal pattern 330 and the side surface of the upper electrode 220. The first spacer SP1 may not cover a side surface VRs of the variable resistance pattern VR. The first spacer SP1 may extend along the side surfaces of the upper electrode 220 and the upper metal pattern 330 and may be in contact (e.g., direct contact) with the portion of the top surface VRu of the variable resistance pattern VR exposed by (e.g., not covered by or in contact with) the upper metal pattern 330. In an implementation, the upper metal pattern 330 and the first spacer SP1 may be on (e.g., may directly contact) the top surface VRu of the variable resistance pattern VR. An outer side surface of the first spacer SP1 and the side surface VRs of the variable resistance pattern VR may be laterally spaced apart from the side surface of the upper metal pattern 330 by the same distance (e.g., in the first direction D1), when measured at the level of the interface between the first spacer SP1 and the variable resistance pattern VR (e.g., outer sides of the first spacer SP1 and the variable resistance pattern VR may be aligned or form a continuous surface). In an implementation, an end VRe of the top surface VRu of the variable resistance pattern VR may be in contact with the outer side surface of the first spacer SP1. The first spacer SP1 may have a thickness ranging from 10 Å to 20 Å. The first spacer SP1 may be formed of or include silicon oxide.

The second spacer SP2 of the spacer structure SS may cover the first spacer SP1 and the side surface VRs of the variable resistance pattern VR. The second spacer SP2 may be in contact (e.g., direct contact) with the outer side surface of the first spacer SP1 and the side surface VRs of the variable resistance pattern VR. The second spacer SP2 may expose (e.g., may not cover) the (e.g., outer) side surface of the lower metal pattern 320. The second spacer SP2 may extend lengthwise along the side surface VRs of the variable resistance pattern VR and may be in contact with the top surface of the lower metal pattern 320 exposed or not covered by the variable resistance pattern VR. In an implementation, the variable resistance pattern VR and the second spacer SP2 may be on the top surface of the lower metal pattern 320. An outer side surface of the second spacer SP2 and the side surface of the lower metal pattern 320 may be laterally spaced apart from the side surface of the variable resistance pattern VR by the same distance (e.g., in the first direction D1), when measured at the level of the interface between the second spacer SP2 and the lower metal pattern 320. In an implementation, the outer side surface of the second spacer SP2 and the side surface of the lower metal pattern 320 may be coplanar with each other (e.g., may be aligned or may form a continuous surface). The second spacer SP2 may conformally cover the side surface of the first spacer SP1 and the side surface of the variable resistance pattern VR. In an implementation, the second spacer SP2 may not have a flat shape, depending on the shapes of the outer side surface of the first spacer SP1 and the side surface VRs of the variable resistance pattern VR. In an implementation, a lower portion SP2a of the second spacer SP2 on the side surface VRs of the variable resistance pattern VR may have a curved shape, similar to that of (e.g., conforming to) the side surface VRs of the variable resistance pattern VR. An upper portion SP2b of the second spacer SP2 on the side surface of the first spacer SP1 may have a flat shape. The second spacer SP2 may have a thickness ranging from 10 Å to 20 Å. The second spacer SP2 may be formed of or include silicon oxide. In an implementation, the second spacer SP2 may be formed of or include silicon nitride or silicon oxynitride.

In an implementation, just two spacers SP1 and SP2 may be used to protect the variable resistance pattern VR of the memory cells MC. This may make it possible to reduce a thickness of the spacer structure SS and moreover a size of the variable resistance memory device. In an implementation, the two spacers SP1 and SP2 may help protect the variable resistance pattern VR during etching steps, which are performed in the process of fabricating the variable resistance memory device. This will be described in more detail in the following description of the fabricating method.

In an implementation, as illustrated in FIG. 4, the first spacer SP1 and the second spacer SP2 may cover the side surfaces of the memory cells MC in both of the first and second directions D1 and D2. In an implementation, the first spacer SP1 and the second spacer SP2 may cover only the side surfaces of the memory cells MC in one of the first and second directions D1 and D2.

In an implementation, as shown in FIG. 6, a conductive polymer layer MP may be between the first spacer SP1 and the second spacer SP2. The conductive polymer layer MP may be on the side surface of the upper electrode 220. The conductive polymer layer MP may be surrounded or encapsulated by the first spacer SP1 and the second spacer SP2. In an implementation, the second spacer SP2 may cover the conductive polymer layer MP on the outer side surface of the first spacer SP1. In an implementation, a portion of the outer side surface of the first spacer SP1 may not be covered by the conductive polymer layer MP, and may be in contact (e.g., direct contact) with the second spacer SP2. The conductive polymer layer MP may be a layer, which is formed of or includes an etch residue that is produced and re-deposited during an etching step, as will be described with reference to the following fabricating method. In an implementation, the conductive polymer layer MP may be formed of or include a metal oxide, in which a metallic element, such as tungsten, titanium, or tantalum, is contained. The conductive polymer layer MP may be surrounded or encapsulated by the first and second spacers SP1 and SP2, and the memory cells MC may not be damaged by the conductive polymer layer MP. In an implementation, all of the first and second spacers SP1 and SP2 and the conductive polymer layer MP may be formed of or include an oxide, and in this case, it may be possible to realize a strong adhesion strength between the first and second spacers SP1 and SP2 and the conductive polymer layer MP and thereby to help prevent the first and second spacers SP1 and SP2 from being delaminated by the conductive polymer layer MP.

In an implementation, the width of the lower metal pattern 320 may be smaller than the width of the intermediate electrode 310 (e.g., as measured in the first direction D1 or the second direction D2). In an implementation, the width of the lower metal pattern 320 may be equal to the width of the variable resistance pattern VR. In an implementation, the side surface of the variable resistance pattern VR may be aligned (e.g., coplanar) with the side surface of the lower metal pattern 320. The second spacer SP2 may extend along the side surface VRs of the variable resistance pattern VR and the side surface of the lower metal pattern 320 and may be in contact (e.g., direct contact) with a portion of the top surface of the intermediate electrode 310, which portion is not covered by the lower metal pattern 320. The outer side surface of the second spacer SP2 and the side surface of the intermediate electrode 310 may be laterally spaced apart from the side surface of the lower metal pattern 320 by the same distance, when measured at the level of the interface between the second spacer SP2 and the intermediate electrode 310. In an implementation, the outer side surface of the second spacer SP2 and the side surface of the intermediate electrode 310 may be coplanar with each other. The following description will refer to the embodiment of FIG. 5.

Referring back to FIGS. 3 and 4, an insulating layer 400 may fill a space between the memory cells MC. Adjacent ones of the memory cells MC may be spaced apart from each other by a distance of 5 nm to 20 nm. The insulating layer 400 may surround the side surfaces of the memory cells MC.

FIGS. 7 to 22 are sectional views of stages in a method of fabricating a variable resistance memory device, according to an embodiment.

Figure 7:
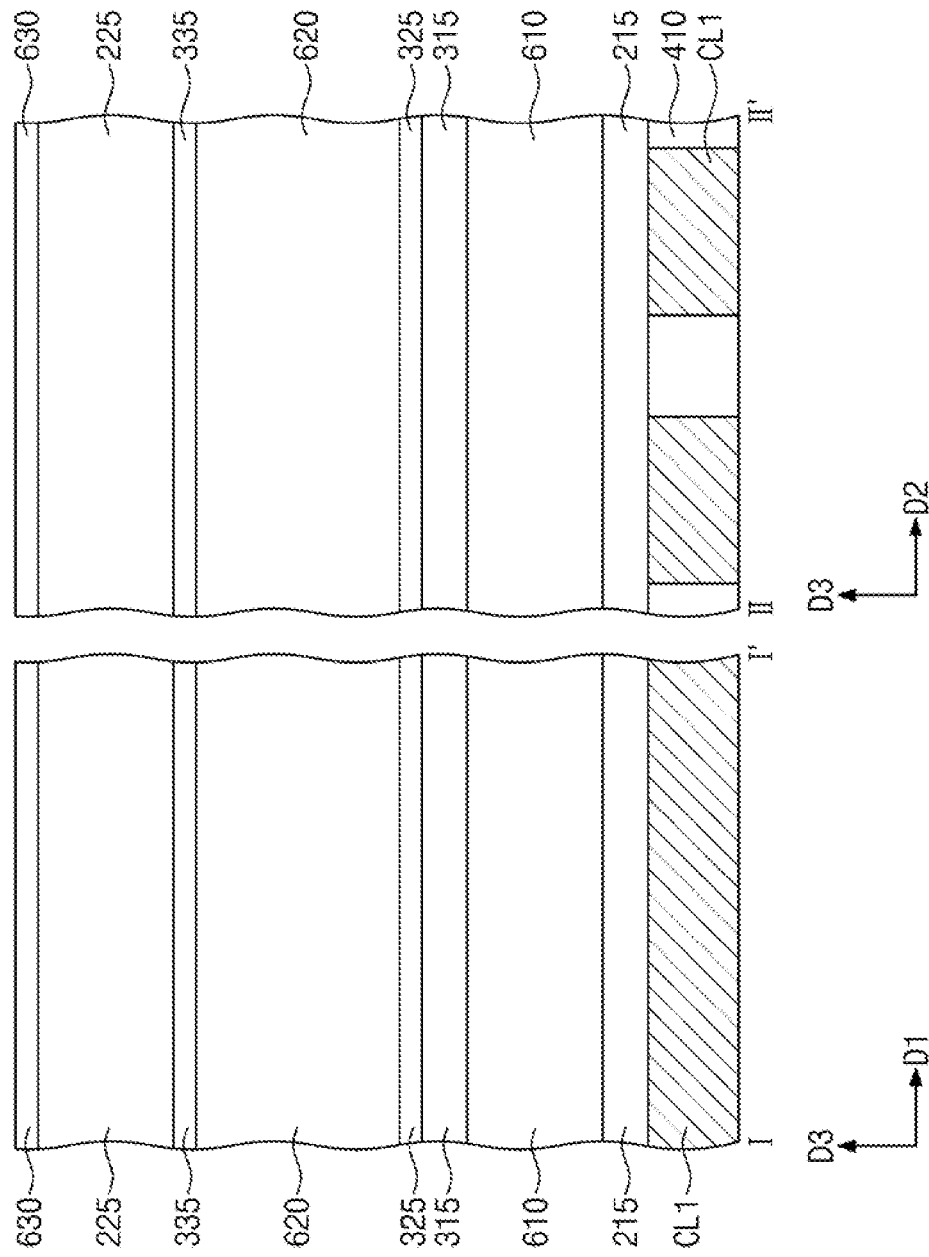
FIGS. 7 to 22 are sectional views of stages in a method of fabricating a variable resistance memory device, according to an embodiment.

Referring to FIG. 7, the first conductive lines CL1 and the interconnection insulating layer 410 may be formed on a substrate. In an implementation, the first conductive lines CL1 may be formed by depositing a conductive material on the substrate and patterning the conductive material. Each of the first conductive lines CL1 may be a line shaped pattern extending (e.g., lengthwise) in the first direction D1. An insulating layer may be formed on the substrate to cover the first conductive lines CL1. The interconnection insulating layer 410 may be formed by performing a planarization process on the insulating layer. In an implementation, the first conductive lines CL1 may have exposed top surfaces. In an implementation, the formation of the first conductive lines CL1 may include forming the interconnection insulating layer 410, in which trenches are formed, on the substrate and filling the trenches with a conductive material.

A lower electrode layer 215, a switch layer 610, an intermediate electrode layer 315, a lower metal layer 325, a variable resistance layer 620, an upper metal layer 335, an upper electrode layer 225, and a first polysilicon layer 630 may be sequentially stacked on the interconnection insulating layer 410. The first polysilicon layer 630 may be a dummy layer, and may be used to prevent material layers therebelow from being damaged during etching processes to be described below.

Thereafter, an X-cut process may be performed to cut material layers, which are stacked on the first conductive lines CL1, in the second direction D2. Hereinafter, the X-cut process will be described in more detail.

Figure 8:
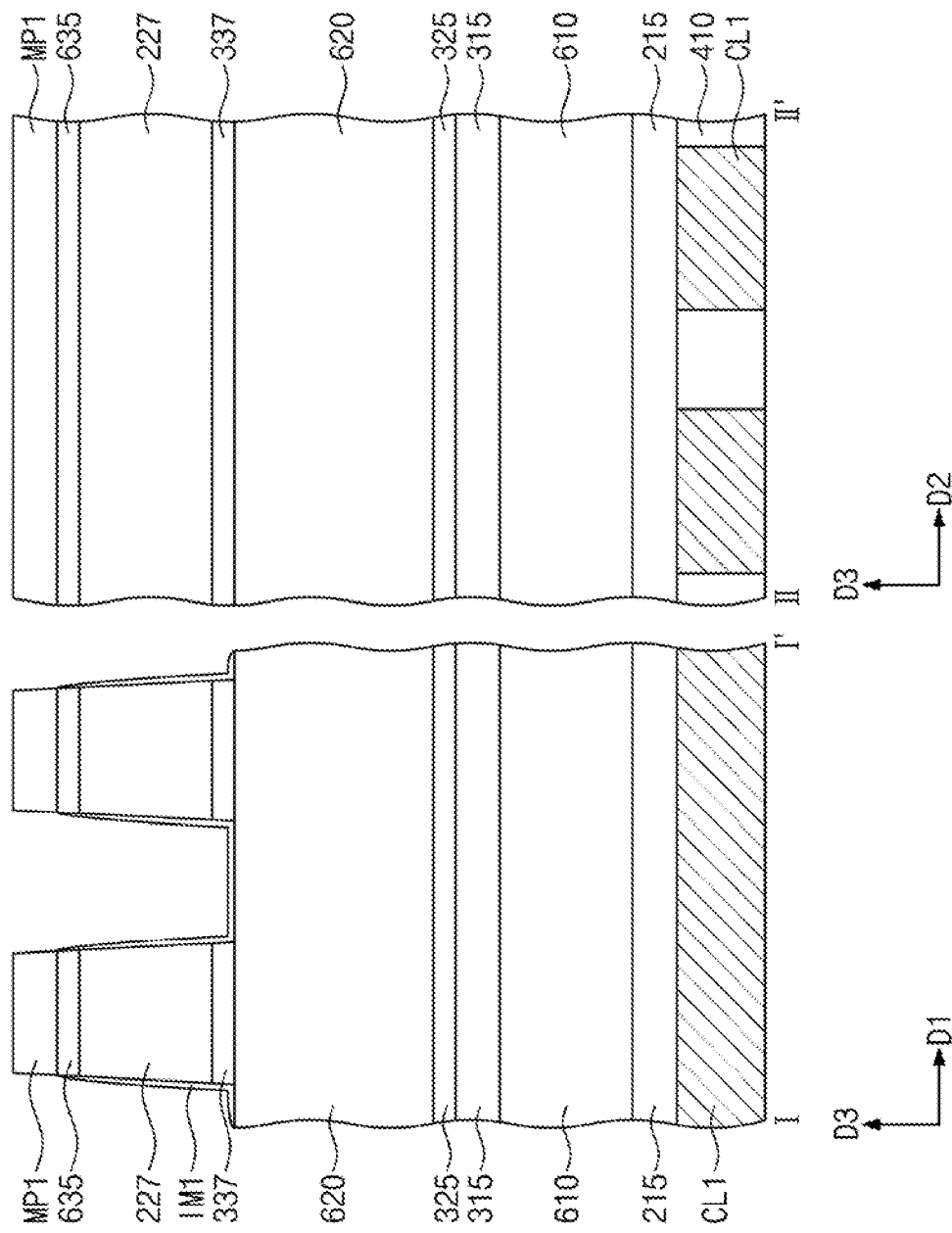

Referring to FIG. 8, a first mask MP1 may be formed on the first polysilicon layer 630. The first mask MP1 may be a line-shape structure extending in the second direction D2. When viewed in a plan view, the first mask MP1 may be formed to cross the first conductive lines CL1.

A first patterning process may be performed on the first polysilicon layer 630, the upper electrode layer 225, and the upper metal layer 335. In an implementation, the first polysilicon layer 630, the upper electrode layer 225, and the upper metal layer 335 may be sequentially etched using the first mask MP1 as an etch mask. As a result of the first patterning process, the first polysilicon layer 630, the upper electrode layer 225, and the upper metal layer 335 may be etched to form a first polysilicon pattern 635, an upper electrode pattern 227, and a preliminary upper metal pattern 337. The first patterning process may include an anisotropic etching process. In an implementation, the first patterning process may include an ion beam etch process or a reactive ion etch process. This etching process may be performed using an argon-containing plasma source and an oxygen- or nitrogen-containing reaction gas. Each of the first polysilicon pattern 635, the upper electrode pattern 227, and the preliminary upper metal pattern 337 may be a line-shaped pattern extending in the second direction D2.

During the first patterning process, a first impurity layer IM1 may be formed on side surfaces of the first polysilicon pattern 635, the upper electrode pattern 227, and the preliminary upper metal pattern 337. The first impurity layer IM1 may be a layer that is formed of or includes an etch residue that is produced and re-deposited during the first patterning process. In an implementation, after the etching of the upper electrode layer 225 or the formation of the upper electrode pattern 227, some of oxygen or nitrogen atoms in the reaction gas may be left on the side surface of the upper electrode pattern 227. Then, an etch residue, which is produced during the process of etching the upper metal layer 335, may be combined with the oxygen or nitrogen atoms on the side surface of the upper electrode pattern 227. In an implementation, in the case where the upper metal layer 335 contains metallic elements, a large amount of impurities or by-products may be produced by the reaction between the material of the upper metal layer 335 and the reaction gas, during the etching process. In an implementation, the first impurity layer IM1 may be formed to cover not only the side surfaces of the first polysilicon pattern 635, the upper electrode pattern 227, and the preliminary upper metal pattern 337, but also a top surface of the variable resistance layer 620 exposed by the first patterning process.

Figure 9:
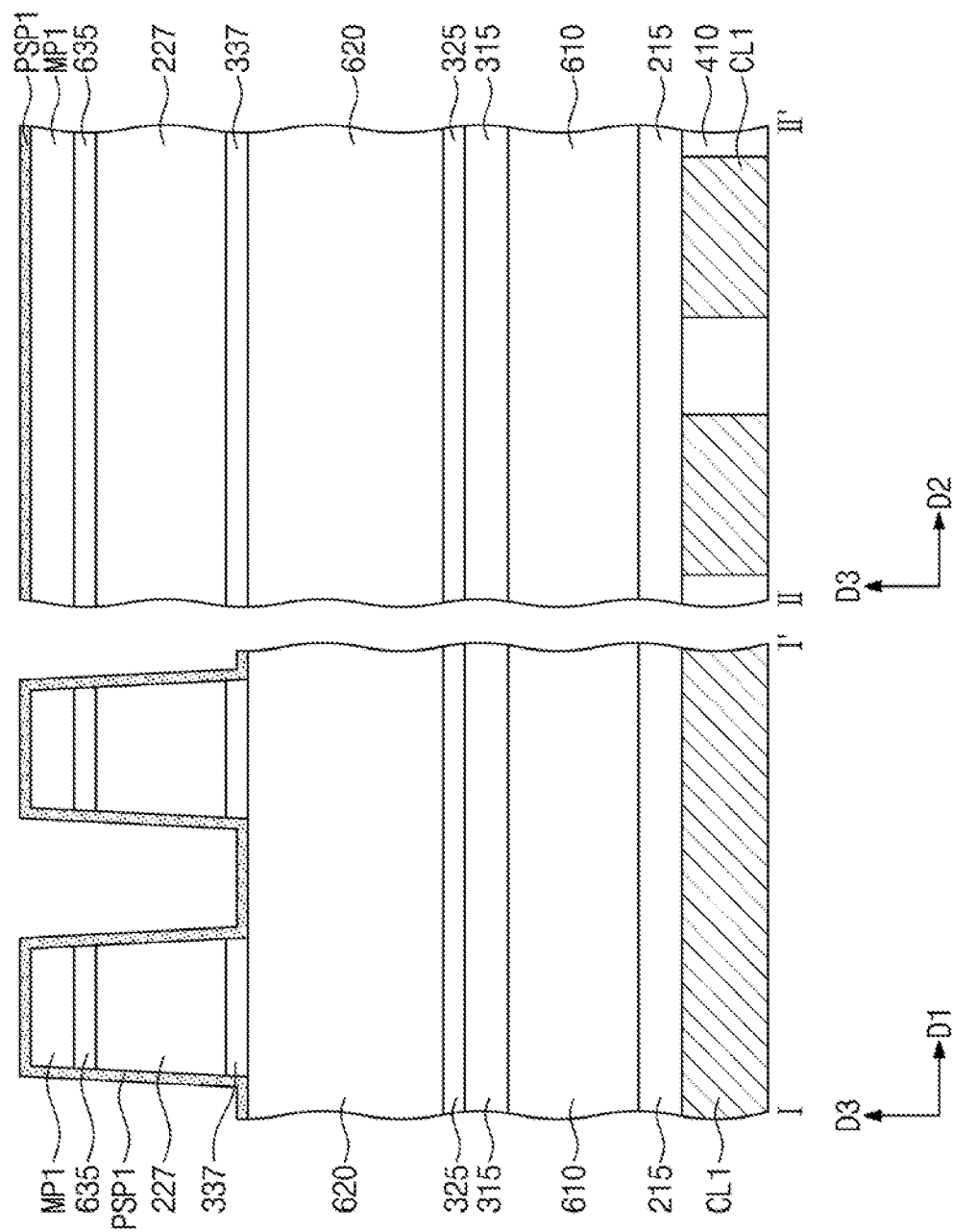

Referring to FIG. 9, a cleaning process may be performed on the first impurity layer IM1. The cleaning process may be performed to remove the first impurity layer IM1 and to expose the side surfaces of the first polysilicon pattern 635, the upper electrode pattern 227, and the preliminary upper metal pattern 337 and the top surface of the variable resistance layer 620.

Thereafter, a first spacer layer PSP1 may be formed to cover a resulting structure, on which the first patterning process and the cleaning process of FIGS. 8 and 9 have been performed. The first spacer layer PSP1 may be formed by an atomic layer deposition (ALD) process or a chemical vapor deposition (CVD) process. The first spacer layer PSP1 may be formed to cover the side surfaces of the first polysilicon pattern 635, the upper electrode pattern 227, and the preliminary upper metal pattern 337. In an implementation, the first spacer layer PSP1 may be formed to conformally cover the top surface of the variable resistance layer 620. In an implementation, the first spacer layer PSP1 may cover the first mask MP1. The first spacer layer PSP1 may be formed of or include silicon oxide.

Figure 10:
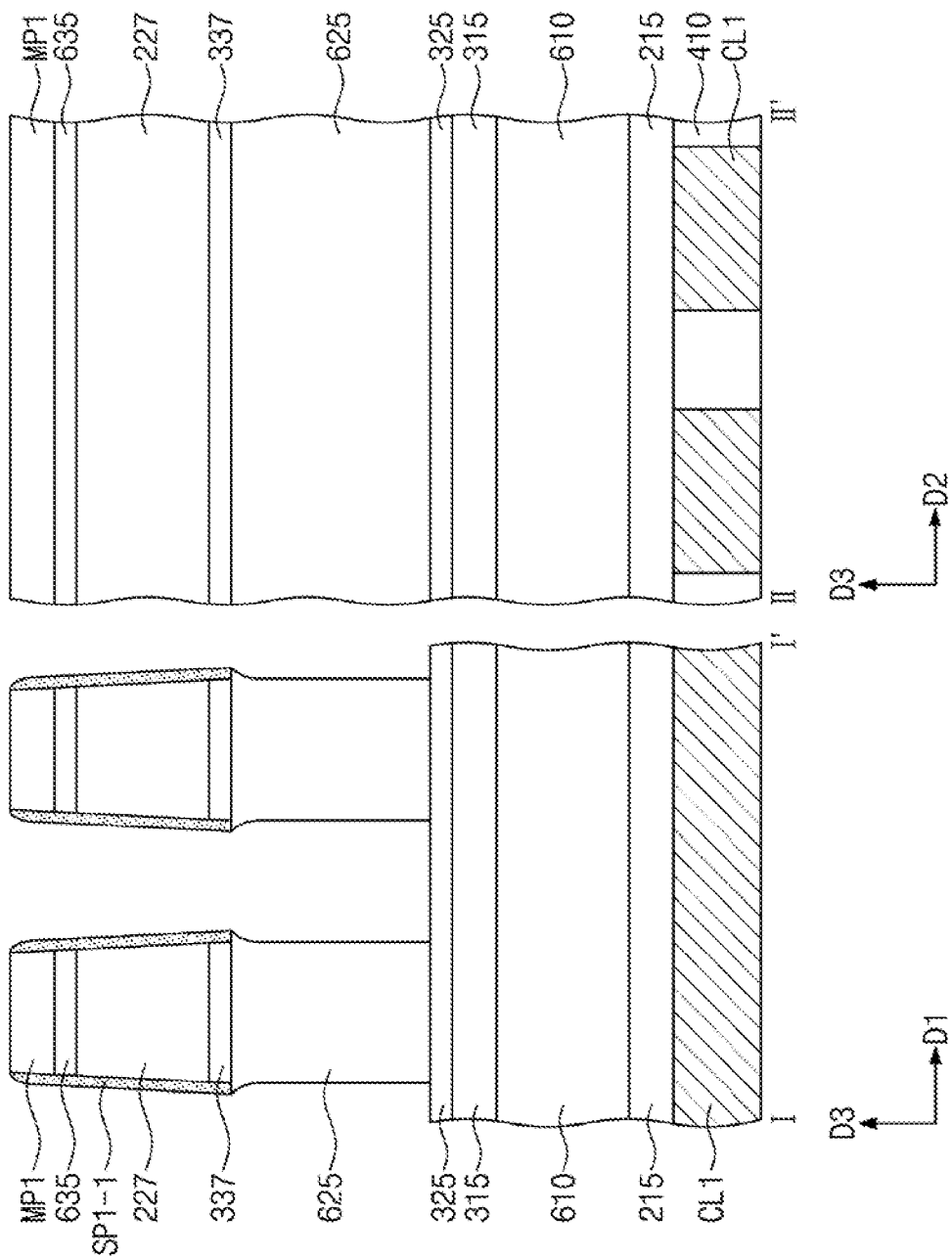

Referring to FIG. 10, a second patterning process may be performed on the variable resistance layer 620. In an implementation, the first spacer layer PSP1 may be etched by the second patterning process. In an implementation, portions of the first spacer layer PSP1 covering a top surface of the first mask MP1 and the top surface of the variable resistance layer 620 may be removed to form a first sub-spacer SP1-1. The first sub-spacer SP1-1 may cover side surfaces of the first mask MP1, the first polysilicon pattern 635, the upper electrode pattern 227, and the preliminary upper metal pattern 337 in the first direction D1 (e.g., may cover surfaces that face in the first direction D1). In an implementation, a thickness of the first sub-spacer SP1-1 may be reduced by the first patterning process.

In an implementation, the second patterning process may be performed to further etch the variable resistance layer 620 using the first mask MP1 and the first sub-spacer SP1-1 as an etch mask. A preliminary variable resistance pattern 625 may be formed as a result of the etching of the variable resistance layer 620 by the second patterning process. The second patterning process may include an anisotropic etching process. In an implementation, the first patterning process may include an ion beam etch process or a reactive ion etch process. This etching process may be performed using an argon-containing plasma source and an oxygen-containing reaction gas. The second patterning process may be performed to etch only the variable resistance layer 620 that is made of oxide. In this case, it is possible to help prevent or suppress impurities from being re-deposited on the side surfaces of the upper electrode pattern 227 and the preliminary upper metal pattern 337.

The preliminary variable resistance pattern 625 may be formed to have a line shape extending in the second direction D2. When measured in the first direction D1, the preliminary variable resistance pattern 625 may be formed to have a width that decreases with increasing distance from the preliminary upper metal pattern 337 (e.g., the width of the preliminary variable resistance pattern 625 proximate to the preliminary upper metal pattern 337 in the third direction D3 may be greater than the width of the preliminary variable resistance pattern 625 distal to the preliminary upper metal pattern 337 in the third direction D3). In an implementation, the variable resistance layer 620 may be anisotropically etched during the second patterning process, and a side surface of the preliminary variable resistance pattern 625 may be partially etched by the reaction gas for the second patterning process. An end portion of a top surface of the preliminary variable resistance pattern 625 may be in contact with an outer side surface of the first sub-spacer SP1-1.

Figure 11:
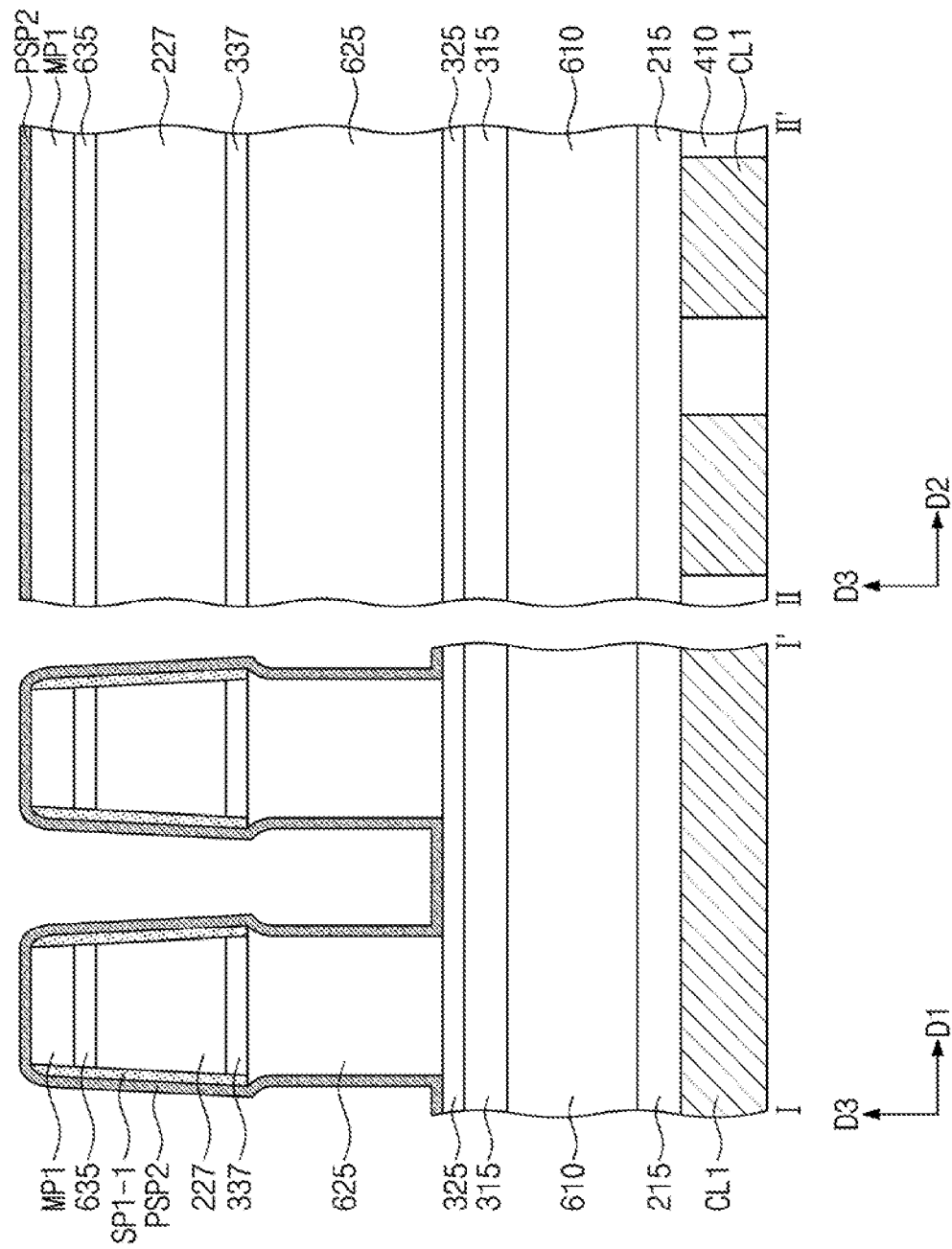

Referring to FIG. 11, a second spacer layer PSP2 may be formed to cover a resulting structure, on which the second patterning process of FIG. 10 has been performed. The second spacer layer PSP2 may be formed by an atomic layer deposition (ALD) process or a chemical vapor deposition (CVD) process. The second spacer layer PSP2 may be formed to cover the outer side surface of the first sub-spacer SP1-1 and the side surface of the preliminary variable resistance pattern 625. In an implementation, the second spacer layer PSP2 may conformally cover an exposed portion of the top surface of the lower metal layer 325. In an implementation, the second spacer layer PSP2 may be formed to cover the first mask MP1. The second spacer layer PSP2 may be formed of or include silicon oxide.

Figure 12:
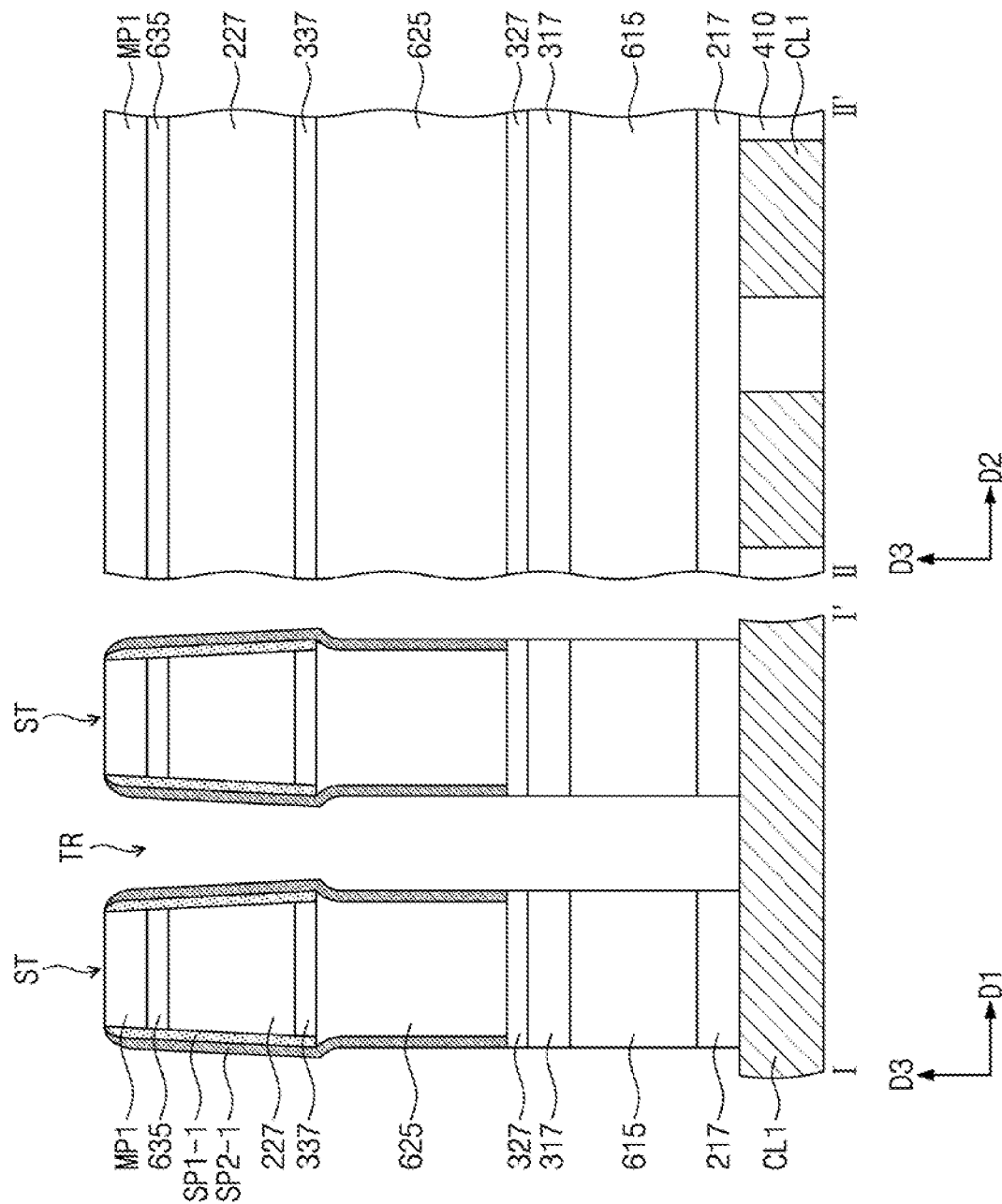

Referring to FIG. 12, a third patterning process may be performed on the lower metal layer 325, the intermediate electrode layer 315, the switch layer 610, and the lower electrode layer 215. In an implementation, the second spacer layer PSP2 may be etched by the third patterning process. In an implementation, a second sub-spacer SP2-1 may be formed by removing portions of the second spacer layer PSP2 covering the top surfaces of the first mask MP1 and the lower metal layer 325. The second sub-spacer SP2-1 may be formed to cover the outer side surface of the first sub-spacer SP1-1 and the side surfaces of the preliminary upper metal pattern 337 in the first direction D1. In an implementation, a thickness of the second sub-spacer SP2-1 may be reduced by the third patterning process.

In an implementation, the third patterning process may also be performed to sequentially etch the lower metal layer 325, the intermediate electrode layer 315, the switch layer 610, and the lower electrode layer 215 using the first mask MP1 and the second sub-spacer SP2-1 as an etch mask. A preliminary lower metal pattern 327, an intermediate electrode pattern 317, a preliminary switching pattern 615, and a lower electrode pattern 217 may be formed as a result of the etching of the lower metal layer 325, the intermediate electrode layer 315, the switch layer 610, and the lower electrode layer 215 by the third patterning process. The third patterning process may include an anisotropic etching process. In an implementation, the first patterning process may include an ion beam etch process or a reactive ion etch process. This etching process may be performed using an argon-containing plasma source and an oxygen- or nitrogen-containing reaction gas.

The lower electrode pattern 217, the preliminary switching pattern 615, the intermediate electrode pattern 317, the preliminary lower metal pattern 327, the preliminary variable resistance pattern 625, the preliminary upper metal pattern 337, and the upper electrode pattern 227, which are formed by the first to third patterning processes, may constitute preliminary structures ST. The preliminary structures ST may be extended in the second direction D2 and may be spaced apart from each other in the first direction D1 by a trench TR therebetween.

In an implementation, the first to third patterning processes and the process of depositing the first and second sub-spacers SP1-1 and SP2-1 may be performed in situ. In an implementation, the first to third patterning processes may be an etching process, in which oxygen is used, and the process of depositing the first and second sub-spacers SP1-1 and SP2-1 may be an oxide deposition process, in which the oxygen in the etching process is used. In an implementation, the first to third patterning processes and the process of depositing the first and second sub-spacers SP1-1 and SP2-1 may be successively performed in the same chamber.

Widths of the preliminary lower metal pattern 327, the intermediate electrode pattern 317, the preliminary switching pattern 615, and the lower electrode pattern 217 in the first direction D1 may be larger than the width of the preliminary variable resistance pattern 625. In an implementation, side surfaces of the preliminary lower metal pattern 327, the intermediate electrode pattern 317, the preliminary switching pattern 615, and the lower electrode pattern 217 may be aligned to or with an outer side surface of the second sub-spacer SP2-1.

In an implementation, as illustrated in FIGS. 10 to 12, the second patterning process may be performed to etch only the variable resistance layer 620. In an implementation, the second patterning process may be performed to etch not only the variable resistance layer 620 but also the lower metal layer 325.

Figure 13:
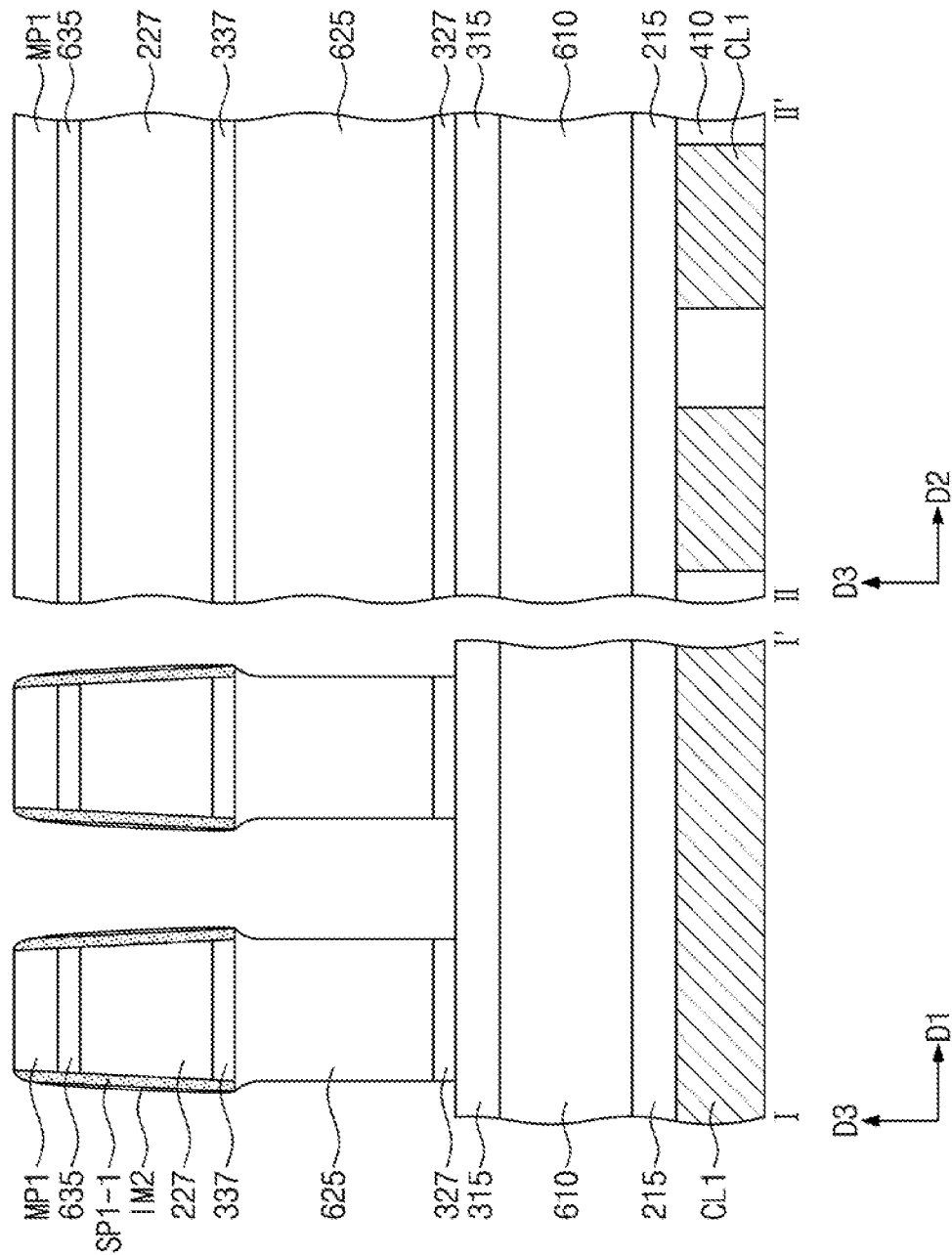

Referring to FIG. 13, the preliminary variable resistance pattern 625 may be formed as a result of the etching of the variable resistance layer 620 by the second patterning process. The process of etching the variable resistance layer 620 may be performed in the same or similar manner as that described with reference to FIG. 10.

The second patterning process may be performed to further etch the lower metal layer 325, and thus, the preliminary lower metal pattern 327 may be formed below the preliminary variable resistance pattern 625.

During the second patterning process, a second impurity layer IM2 may be formed on the outer side surface of the first sub-spacer SP1-1. The second impurity layer IM2 may correspond to the conductive polymer layer MP described with reference to FIG. 6. The second impurity layer IM2 may be a layer, which is formed of or include an etch residue that is produced and re-deposited during the second patterning process. In an implementation, an etch residue, which is produced during the process of etching the lower metal layer 325, may be deposited on at least a portion of the outer side surface of the first sub-spacer SP1-1. In an implementation, in the case where the lower metal layer 325 contains metallic elements, a large amount of impurities or by-products may be produced by the reaction between the material of the lower metal layer 325 and the reaction gas, during the etching process. The second impurity layer IM2 may be formed of or include an oxide material, which is formed by chemical reaction between the metallic elements in the lower metal layer 325 and the oxygen atoms in the reaction gas.

Figure 14:
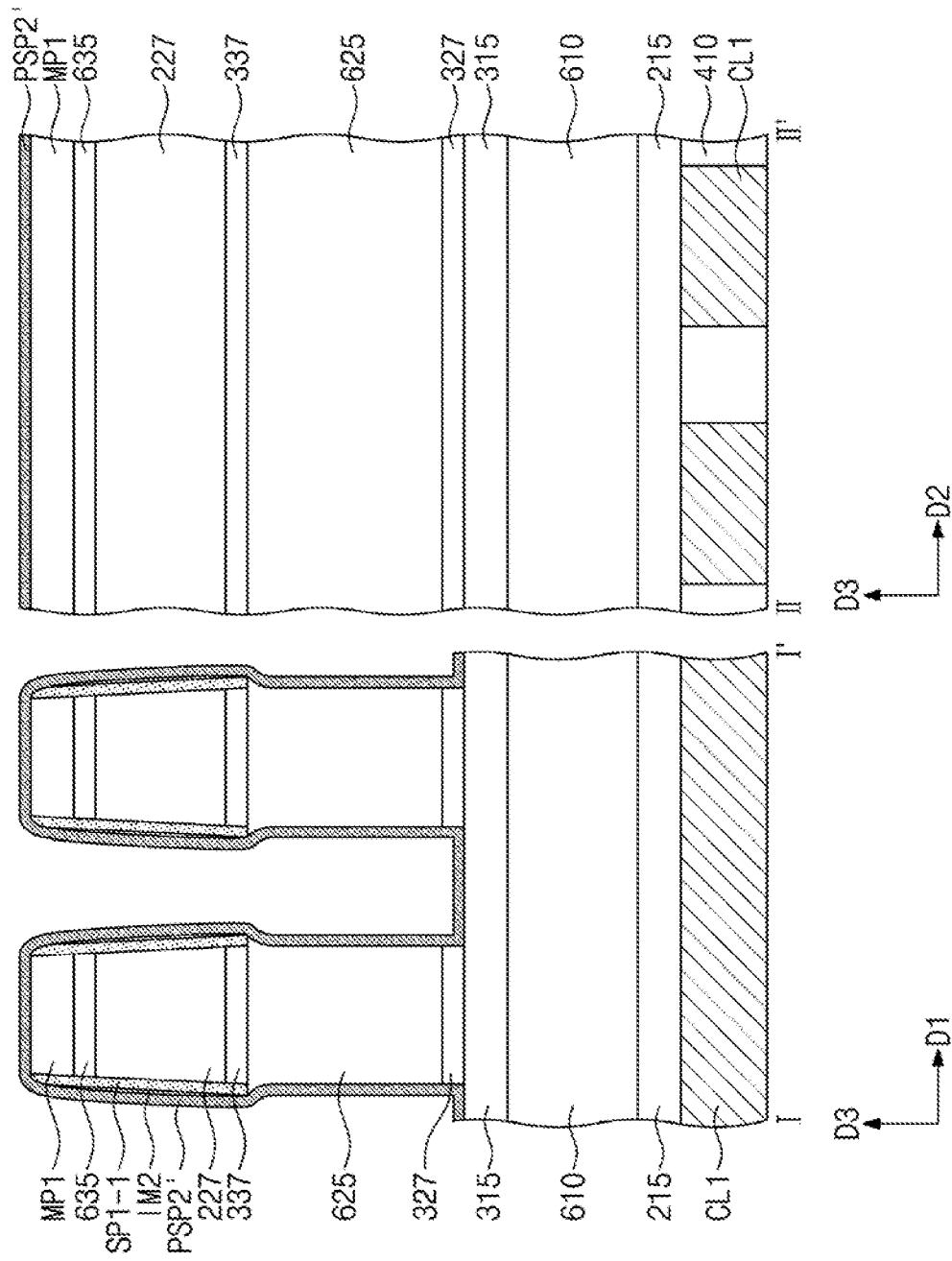

Referring to FIG. 14, a second spacer layer PSP2' may be formed to cover a resulting structure, on which the second patterning process of FIG. 13 is performed. The second spacer layer PSP2' may be formed by an atomic layer deposition (ALD) process or a chemical vapor deposition (CVD) process. The second spacer layer PSP2' may be formed to cover the outer side surface of the first sub-spacer SP1-1, the side surface of the preliminary variable resistance pattern 625, and the side surface of the preliminary lower metal pattern 327. In an implementation, the second spacer layer PSP2' may conformally cover an exposed portion of the top surface of the intermediate electrode layer 315. In an implementation, the second spacer layer PSP2' may be formed to cover the first mask MP1. The second spacer layer PSP2' may be formed of or include silicon oxide.

Figure 15:
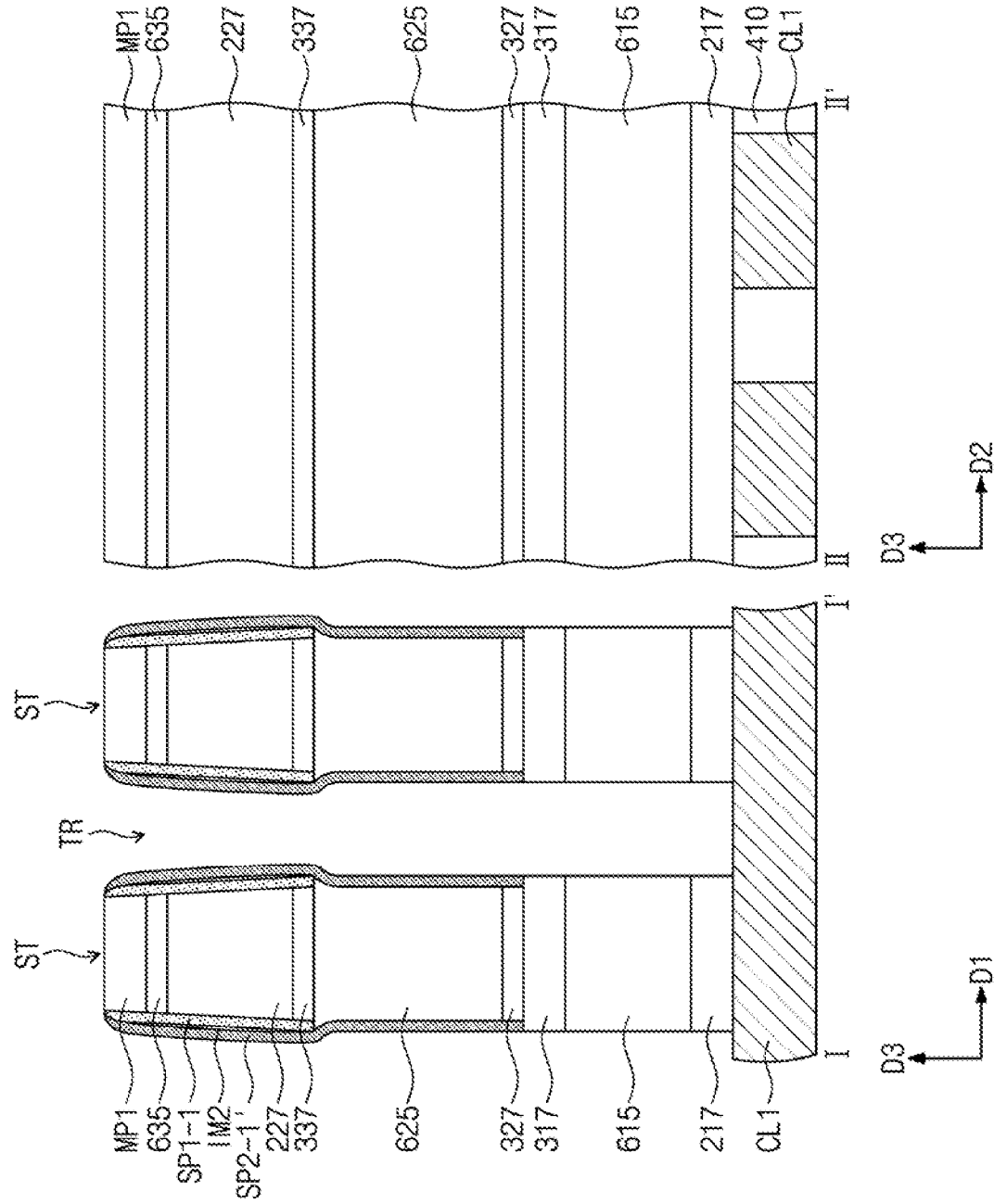

Referring to FIG. 15, a third patterning process may be performed on the intermediate electrode layer 315, the switch layer 610, and the lower electrode layer 215. In an implementation, portions of the second spacer layer PSP2', which cover the top surfaces of the first mask MP1 and the lower metal layer 325, may be removed to form the second sub-spacer SP2-1'. The intermediate electrode layer 315, the switch layer 610, and the lower electrode layer 215 may be etched to form the intermediate electrode pattern 317, the preliminary switching pattern 615, and the lower electrode pattern 217. The third patterning process may be performed in the same or similar manner as that described with reference to the FIG. 12.

The widths of the intermediate electrode pattern 317, the preliminary switching pattern 615, and the lower electrode pattern 217 in the first direction D1 may be larger than the width of the preliminary variable resistance pattern 625. In an implementation, the side surfaces of the intermediate electrode pattern 317, the preliminary switching pattern 615, and the lower electrode pattern 217 may be aligned to or with the outer side surface of the second sub-spacer SP2-1'.

In an implementation, the second impurity layer IM2 may be between the first sub-spacer SP1-1 and the second sub-spacer SP2-1'. In an implementation, the first and second sub-spacers SP1-1 and SP2-1' may be formed of or include silicon oxide, and the second impurity layer IM2 may be formed of or include an oxide. In this case, it may be possible to increase an adhesion strength between the first and second sub-spacers SP1-1 and SP2-1' and the second impurity layer IM2 and thereby to prevent the second sub-spacer SP2-1' from being detached or delaminated from the first sub-spacer SP1-1 during several process steps to be described below.

Hereinafter, the description that follows will refer to the embodiments of FIGS. 10 to 12.

Figure 16:
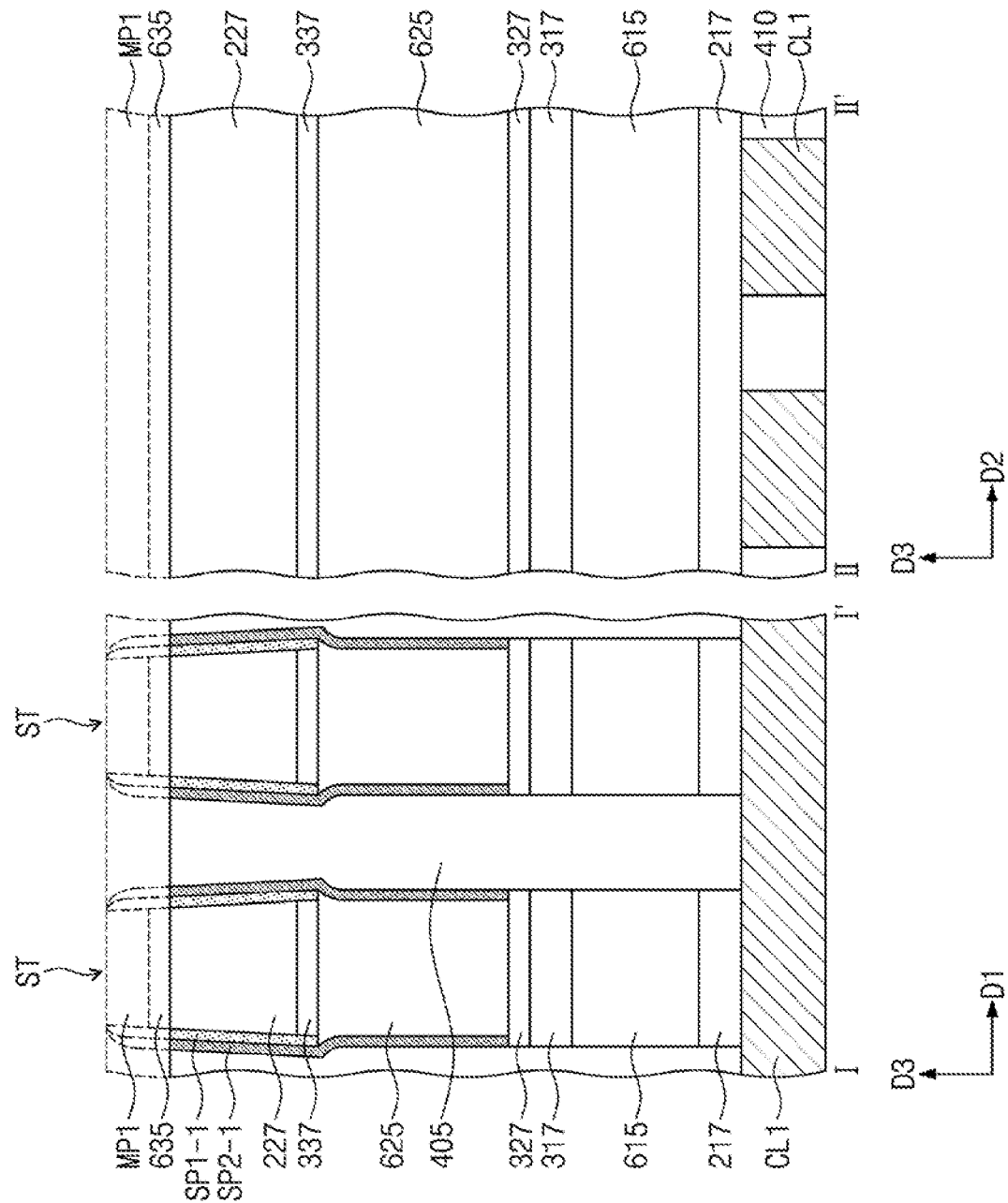

Referring to FIG. 16, a first insulating layer 405 may be deposited on the substrate. In an implementation, the first insulating layer 405 may be formed by filling the trench TR between the preliminary structures ST, which are formed by the first to third patterning processes, with an insulating material. The first insulating layer 405 may be formed of or include silicon oxide.

In the afore-described method of fabricating a variable resistance memory device, fewer sub-spacers may be used to protect the electrode patterns and the variable resistance patterns in several etching processes. In an implementation, it may be possible to effectively reduce a total thickness of the spacers and a size of the variable resistance memory device. In an implementation, the number of the sub-spacers may be reduced, and the overall fabrication process may be simplified.

In an implementation, the spacers may have a small thickness, and it is possible to increase a distance between preliminary structures and to easily provide an insulating material, which is used to form a first insulating layer. Accordingly, it is possible to prevent a defect-causing structure (e.g., an air gap) from being formed in a trench between the preliminary structures and thereby to realize a variable resistance memory device with improved reliability.

Referring further to FIG. 16, a planarization process may be performed on the preliminary structures ST. The planarization process may be performed to remove an upper portion of the first insulating layer 405, the first mask MP1, and the first polysilicon pattern 635. The planarization process may be performed until a top surface of the upper electrode pattern 227 is exposed. In this case, upper portions of the first and second sub-spacers SP1-1 and SP2-1 may also be partially removed by the planarization process. The first insulating layer 405, the first sub-spacer SP1-1, the second sub-spacer SP2-1, and the upper electrode pattern 227 may have top surfaces that are coplanar with each other.

Thereafter, a Y-cut process may be performed to cut the preliminary structures ST in the first direction D1. Hereinafter, the Y-cut process will be described in more detail.

Figure 17:
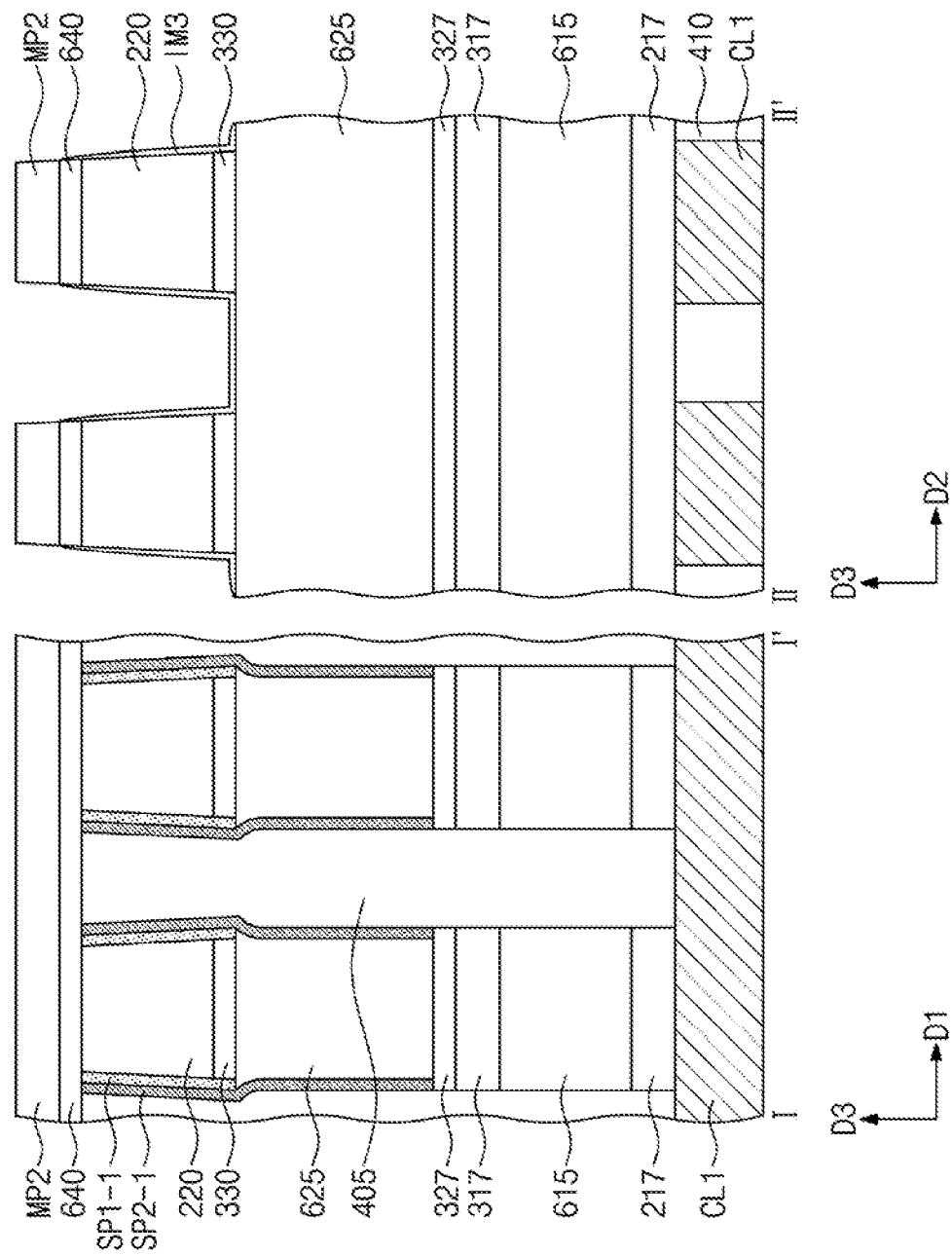

Referring to FIG. 17, a second polysilicon layer may be formed on the first insulating layer 405. The second polysilicon layer may be a dummy layer, which may help prevent material layers below the second polysilicon from being damaged during etching processes to be described below.

Thereafter, a second mask MP2 may be formed on the second polysilicon layer. The second mask MP2 may be a line-shaped pattern extending in the first direction D1. When viewed in a plan view, the second mask MP2 may be formed to cross the preliminary structures ST.

A fourth patterning process may be performed on the second polysilicon layer, the upper electrode pattern 227, and the preliminary upper metal pattern 337. In an implementation, a second polysilicon pattern 640, the upper electrode 220, and the upper metal pattern 330 may be formed by etching the second poly silicon layer, the upper electrode pattern 227, and the preliminary upper metal pattern 337 using the second mask MP2 as an etch mask. The fourth patterning process may include an anisotropic etching process. The fourth patterning process may be performed in the manner similar to the first patterning process. Each of the second polysilicon pattern 640, the upper electrode 220, and the upper metal pattern 330 may be a line-shaped pattern extending in the first direction D1.

During the fourth patterning process, a third impurity layer IM3 may be formed on side surfaces of the second polysilicon pattern 640, the upper electrode 220, and the upper metal pattern 330. The third impurity layer IM3 may be a layer, which is formed of or include an etch residue that is produced and re-deposited during the fourth patterning process. As shown in FIG. 17, the third impurity layer IM3 may cover not only the side surfaces of the second polysilicon pattern 640, the upper electrode 220, and the upper metal pattern 330 but also the top surface of the preliminary variable resistance pattern 625 exposed by the fourth patterning process.

Figure 18:
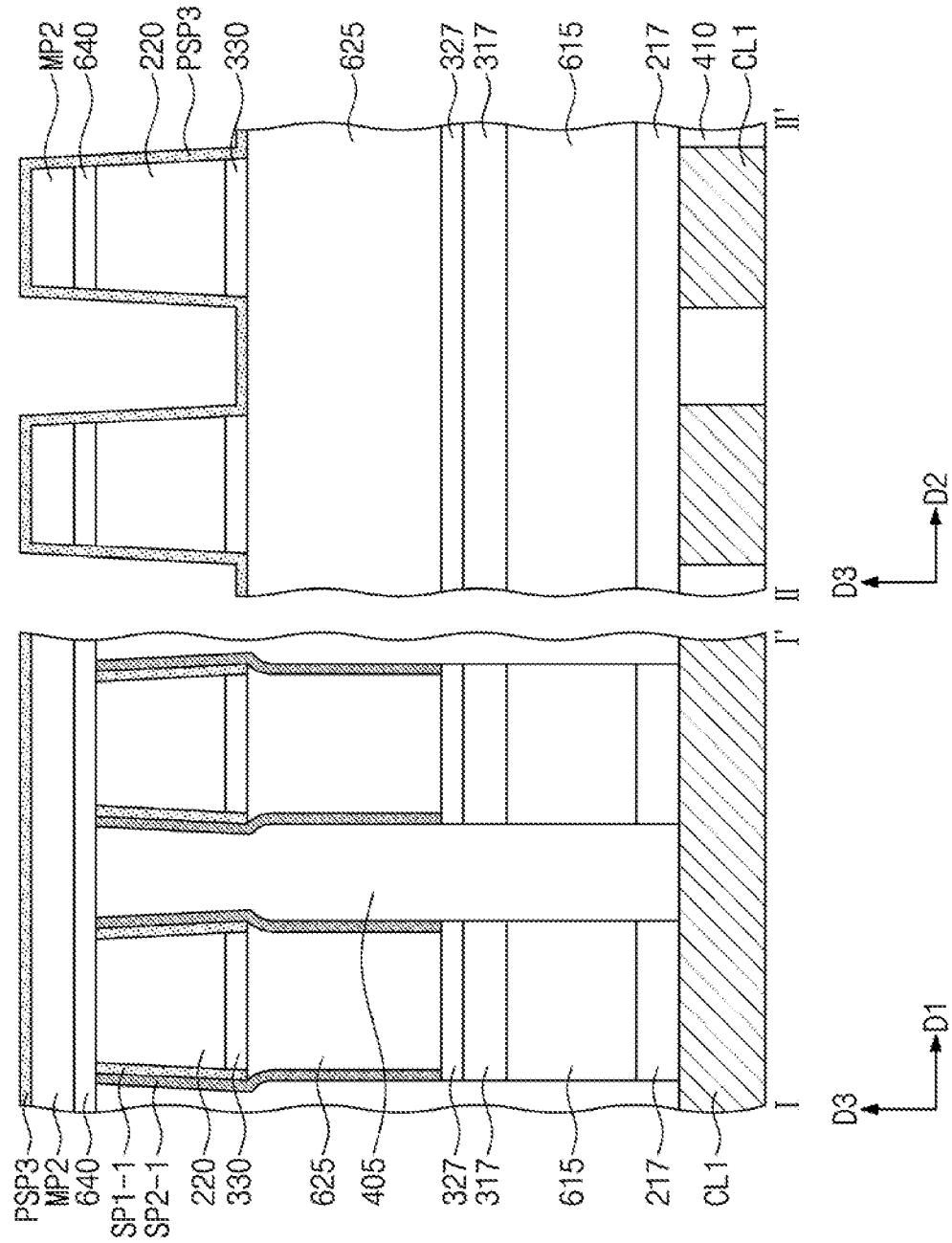

Referring to FIG. 18, a cleaning process may be performed on the third impurity layer IM3. The cleaning process may be performed to remove the third impurity layer IM3 and thereby to expose the side surfaces of the second polysilicon pattern 640, the upper electrode 220, and the upper metal pattern 330 and the top surface of the preliminary variable resistance pattern 625.

Thereafter, a third spacer layer PSP3 may be formed to cover a resulting structure, on which the fourth patterning process and the cleaning process of FIGS. 17 and 18 have been performed. The third spacer layer PSP3 may be formed by an atomic layer deposition (ALD) process or a chemical vapor deposition (CVD) process. The third spacer layer PSP3 may be formed to cover the side surfaces of the second polysilicon pattern 640, the upper electrode 220, and the upper metal pattern 330. In an implementation, the third spacer layer PSP3 may be formed to conformally cover the top surface of the preliminary variable resistance pattern 625. The third spacer layer PSP3 may be formed of or include silicon oxide.

Figure 19:
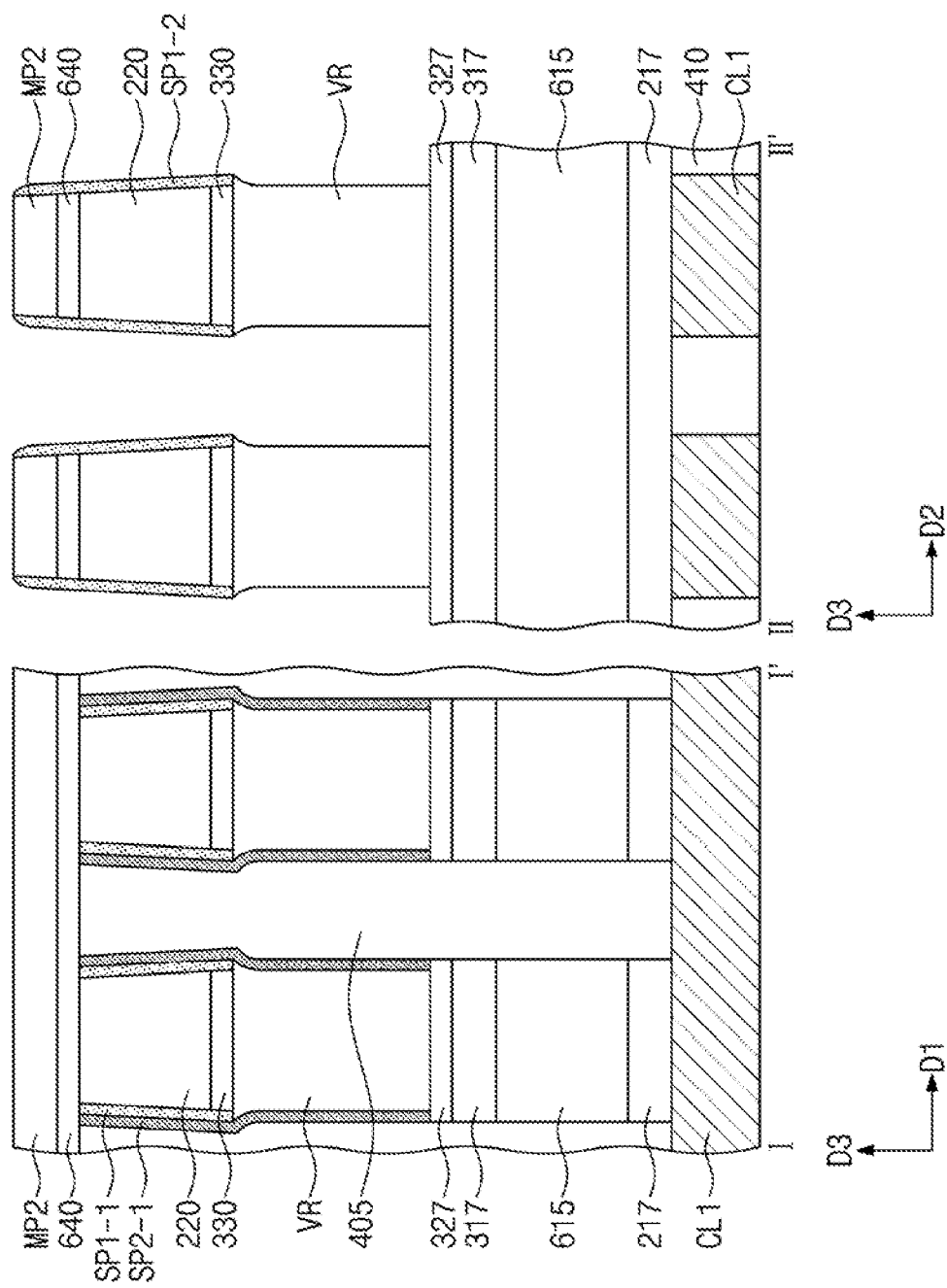

Referring to FIG. 19, a fifth patterning process may be performed on the preliminary variable resistance pattern 625. In an implementation, the third spacer layer PSP3 may be etched by the fifth patterning process. In an implementation, a third sub-spacer SP1-2 may be formed by removing portions of the third spacer layer PSP3, which cover the top surfaces of the second mask MP2 and the preliminary variable resistance pattern 625. The third sub-spacer SP1-2 may be formed to cover the side surfaces of the second mask MP2, the second polysilicon pattern 640, the upper electrode 220, and the upper metal pattern 330 in the second direction D2 (e.g., surfaces that face in the second direction D2). In an implementation, a thickness of the third sub-spacer SP1-2 may be reduced by the fifth patterning process.

The fifth patterning process may be performed to etch the preliminary variable resistance pattern 625 using the second mask MP2 and the third sub-spacer SP1-2 as an etch mask, and thus, the variable resistance pattern VR may be formed below the upper metal pattern 330. The fifth patterning process may include an anisotropic etching process. This etching process may be performed using an argon-containing plasma source and an oxygen-containing reaction gas. In an implementation, the fifth patterning process may be performed to etch only the preliminary variable resistance pattern 625 that is made of an oxide. In this case, it is possible to help prevent or suppress impurities from being re-deposited on the side surfaces of the upper electrode 220 and the upper metal pattern 330.

The variable resistance pattern VR may be etched to have a line shape extending in the first direction D1. The variable resistance pattern VR may be formed to have a width decreasing with increasing distance from the upper metal pattern 330, when measured in the second direction D2. An end of the top surface of the variable resistance pattern VR may be in contact with an outer side surface of the third sub-spacer SP1-2.

Figure 20:
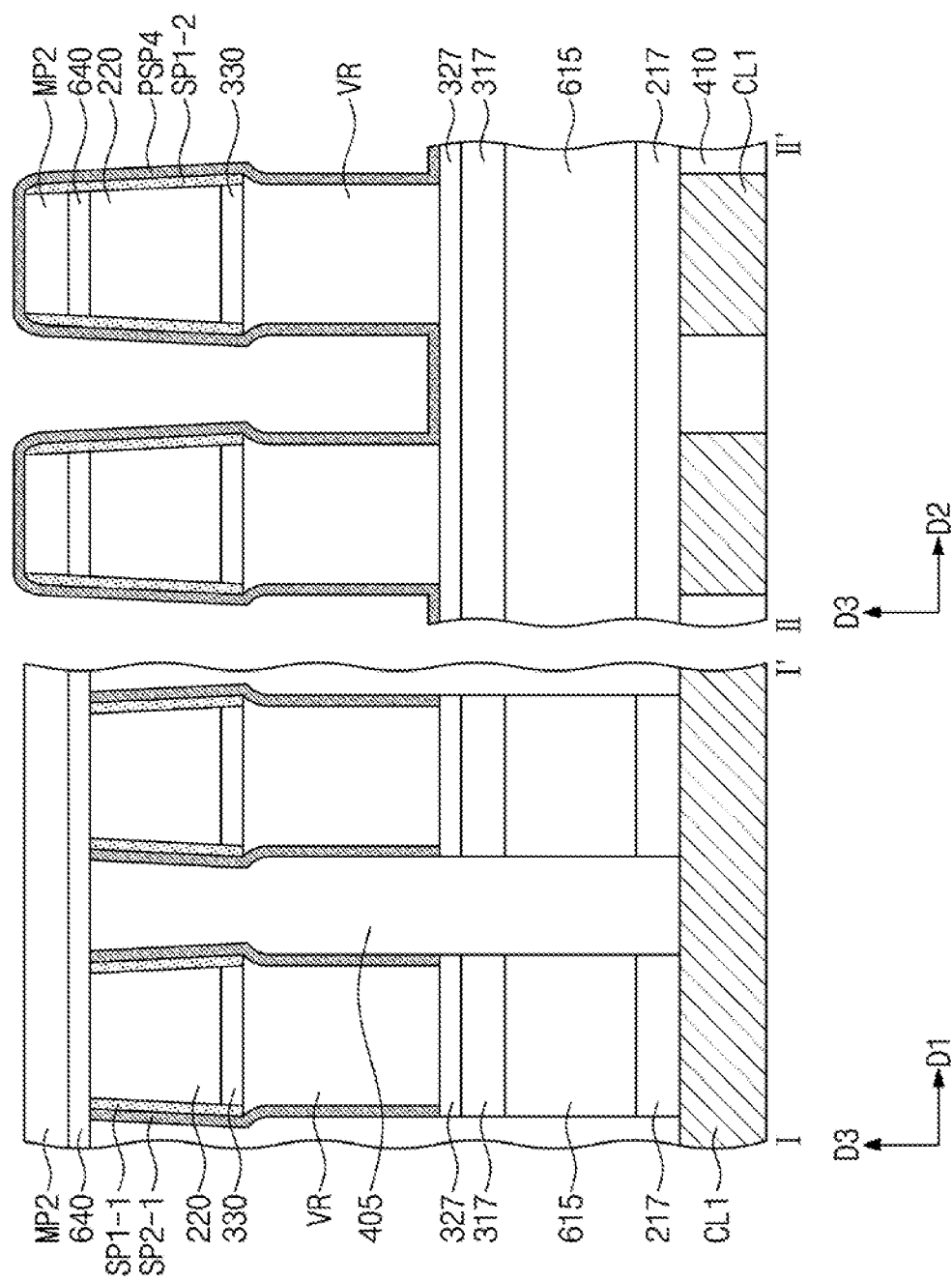

Referring to FIG. 20, a fourth spacer layer PSP4 may be formed to cover a resulting structure, on which the fifth patterning process of FIG. 19 has been performed. The fourth spacer layer PSP4 may be formed by an atomic layer deposition (ALD) process or a chemical vapor deposition (CVD) process. The fourth spacer layer PSP4 may cover the outer side surface of the third sub-spacer SP1-2 and the side surface of the variable resistance pattern VR. In an implementation, the fourth spacer layer PSP4 may be formed to conformally cover an exposed portion of the top surface of the preliminary lower metal pattern 327. The second spacer layer PSP2 may be formed of or include silicon oxide.

Figure 21:
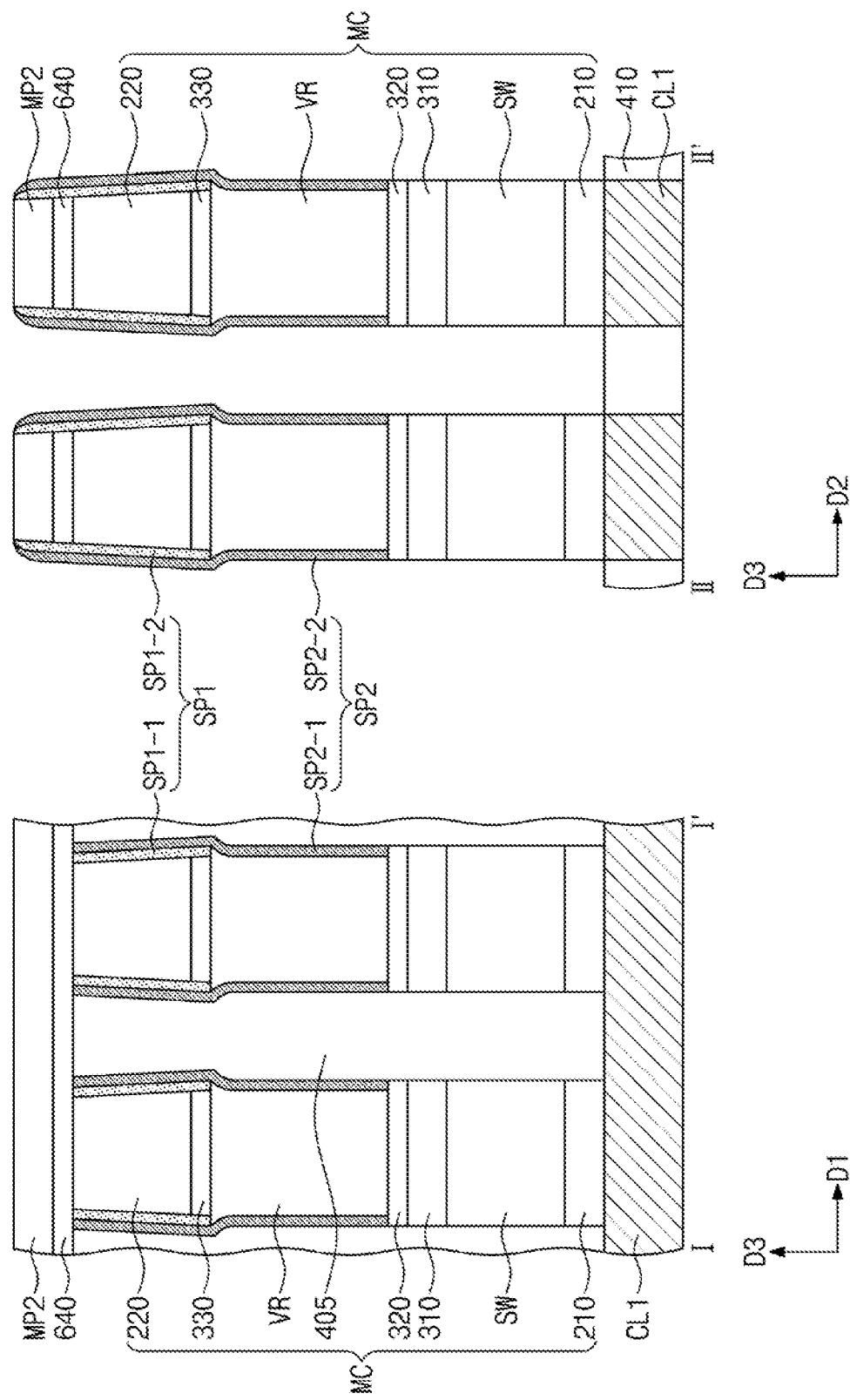

Referring to FIG. 21, a sixth patterning process may be performed on the preliminary lower metal pattern 327, the intermediate electrode pattern 317, the preliminary switching pattern 615, and the lower electrode pattern 217. In an implementation, the fourth spacer layer PSP4 may be etched by the sixth patterning process. In an implementation, portions of the fourth spacer layer PSP4, which cover the top surfaces of the second mask MP2 and the preliminary lower metal pattern 327, may be removed to form a fourth sub-spacer SP2-2. The fourth sub-spacer SP2-2 may be formed to cover the outer side surface of the third sub-spacer SP1-2 and the side surfaces of the upper metal pattern 330 in the second direction D2. In an implementation, a thickness of the fourth sub-spacer SP2-2 may be reduced by the sixth patterning process.

The sixth patterning process may be performed to further etch the preliminary lower metal pattern 327, the intermediate electrode pattern 317, the preliminary switching pattern 615, and the lower electrode pattern 217 sequentially using the second mask MP2 and the fourth sub-spacer SP2-2 as an etch mask, and thus, the lower metal pattern 320, the intermediate electrode 310, the switching pattern SW, and the lower electrode 210 may be formed between the variable resistance pattern VR and the first conductive lines CL1. The sixth patterning process may include an anisotropic etching process. This etching process may be performed using an argon-containing plasma source and an oxygen- or nitrogen-containing reaction gas.

The lower electrode 210, the switching pattern SW, the intermediate electrode 310, the lower metal pattern 320, the variable resistance pattern VR, the upper metal pattern 330, and the upper electrode 220, which are formed by the fourth to sixth patterning process, may constitute the memory cell MC. The memory cells MC may be arranged to be spaced apart from each other in the first and second directions D1 and D2.

The first sub-spacer SP1-1 formed on the side surfaces of each of the memory cells MC in the first direction D1 may be connected to (e.g., continuous with) the third sub-spacer SP1-2 formed on the side surfaces in the second direction D2, and in this case, the first and third sub-spacers SP1-1 and SP1-2 may form a single object serving as the first spacer SP1 of FIG. 4. The second sub-spacer SP2-1 formed on the side surfaces of each of the memory cells MC in the first direction D1 may be connected to (e.g., continuous with) the fourth sub-spacer SP2-2 formed on the side surfaces in the second direction D2, and in this case, the second and fourth sub-spacers SP2-1 and SP2-2 may form a single object serving as the second spacer SP2 of FIG. 4.

Figure 22:
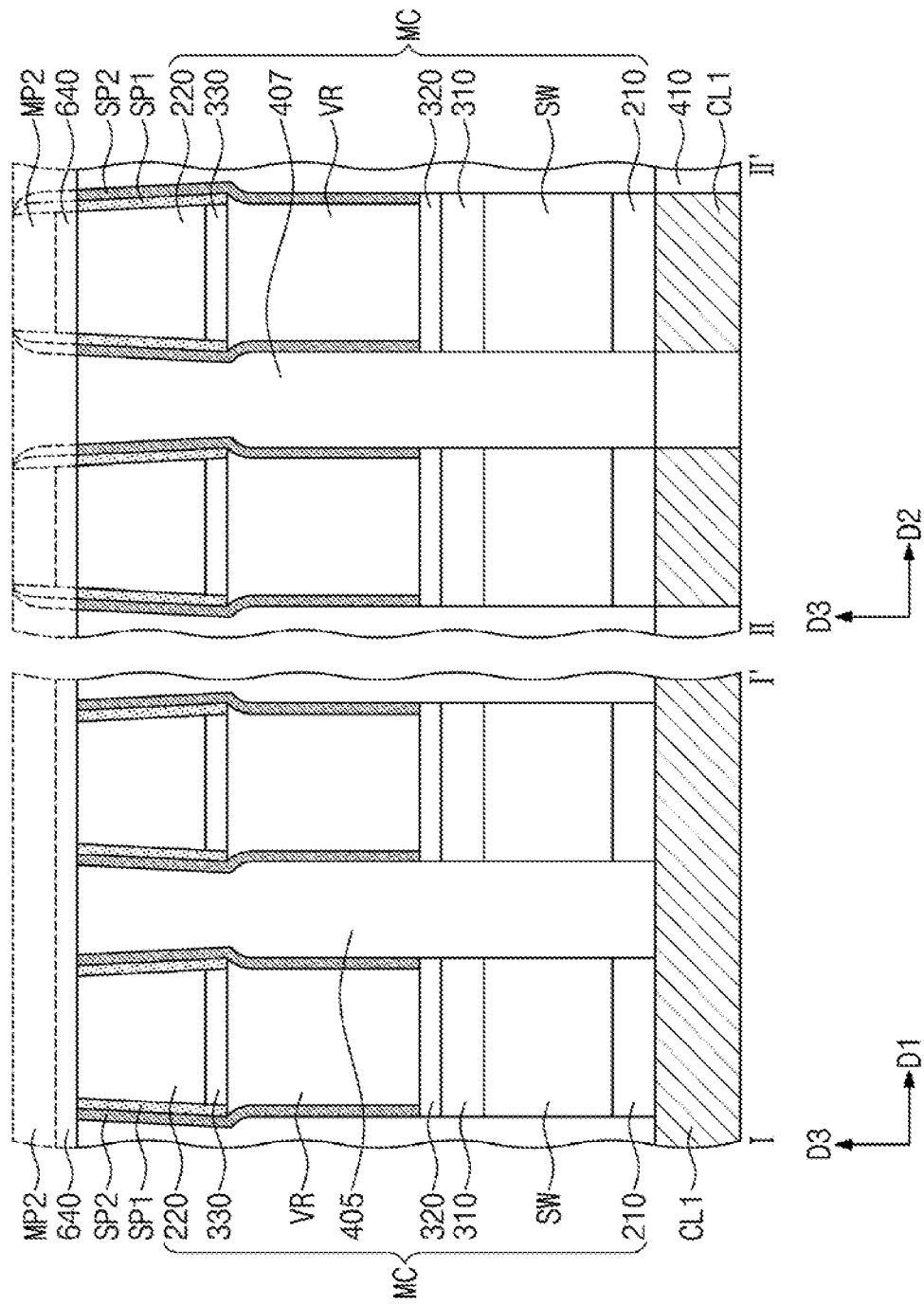

Referring to FIG. 22, a second insulating layer 407 may be deposited on the substrate. In an implementation, the second insulating layer 407 may be formed by filling a trench between the memory cells MC, which are formed by the fourth to sixth patterning process, with an insulating material. The second insulating layer 407 may be formed of or include silicon oxide. The first insulating layer 405 and the second insulating layer 407 may be formed to fill a space between the memory cells MC, and the first and second insulating layers 405 and 407 may constitute the insulating layer 400 described with reference to FIG. 4.

A planarization process may be performed on the memory cells MC. The planarization process may be performed to remove an upper portion of the second insulating layer 407, the second mask MP2, and the second polysilicon pattern 640. The planarization process may be performed until a top surface of the upper electrode 220 is exposed. In this case, upper portions of the first and second spacers SP1 and SP2 may also be partially removed by the planarization process. The second insulating layer 407, the first spacer SP1, the second spacer SP2, and the upper electrode 220 may be formed to have top surfaces that are substantially coplanar with each other.

Referring back to FIG. 4, the second conductive lines CL2 may be formed on the memory cells MC. The second conductive lines CL2 may be formed to have a line shape extending in the second direction D2. When viewed in a plan view, the second conductive lines CL2 may be formed to cross the first conductive lines CL1.

A variable resistance memory device according to an embodiment may be fabricated by the afore-described method. In an implementation, as illustrated in FIGS. 8 to 22, the memory cells MC may be formed by performing the X- and Y-cut processes on the material layers, which are formed on the first conductive lines CL1. In an implementation, a mask pattern, which includes a plurality of island-type patterns spaced apart from each other in the first and second directions D1 and D2, may be formed on the material layers, and then, an etching processes may be performed on the material layers using the mask pattern as an etch mask.

According to an embodiment, a variable resistance memory device may include a spacer structure, which is configured to protect a variable resistance pattern of a memory cell while using less spacers. This may make it possible to reduce a thickness of the spacer structure and a size of the variable resistance memory device.

In a method of fabricating a variable resistance memory device according to an embodiment, fewer sub-spacers may be used to protect electrode patterns and variable resistance patterns in several etching processes. Accordingly, it is possible to effectively reduce a total thickness of the spacers and a size of the variable resistance memory device. In addition, the number of the sub-spacers may be reduced, and the overall fabrication process may be simplified.

Furthermore, the spacers may have a small thickness, and it is possible to increase a distance between preliminary structures and to easily provide an insulating material, which is used to form a first insulating layer. Accordingly, it is possible to prevent a defect-causing structure (e.g., an air gap) from being formed in a trench between the preliminary structures and thereby to realize a variable resistance memory device with improved reliability.

One or more embodiments may provide a variable resistance memory device with improved reliability.

One or more embodiments may provide a method of fabricating a variable resistance memory device in a simplified manner.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A variable resistance memory device, comprising:
   first conductive lines extending in a first direction;
   second conductive lines extending in a second direction crossing the first direction; and
   memory cells at respective intersection points of the first conductive lines and the second conductive lines,
   wherein each of the memory cells includes:
   a switching pattern, an intermediate electrode, a variable resistance pattern, and an upper electrode, which are between the first and second conductive lines and are connected in series; and
   a spacer structure including a first spacer and a second spacer, the first spacer being on a side surface of the upper electrode, and the second spacer covering the first spacer and a side surface of the variable resistance pattern such that the second spacer is in contact with the side surface of the variable resistance pattern.

2. The device as claimed in claim 1, wherein:
   a width of the variable resistance pattern at a top surface thereof is larger than a width of the upper electrode, and
   a bottom end of the first spacer is in contact with a portion of the top surface of the variable resistance pattern that is not covered by the upper electrode.

3. The device as claimed in claim 2, wherein the side surface of the variable resistance pattern and an outer side surface of the first spacer are laterally spaced apart from the side surface of the upper electrode by a same distance, when measured at a level of an interface between the variable resistance pattern and the first spacer.

4. The device as claimed in claim 2, wherein a width of a portion of the variable resistance pattern proximate to the upper electrode is greater than a width of a portion of the variable resistance pattern distal to the upper electrode.

5. The device as claimed in claim 1, further comprising an upper metal pattern between the variable resistance pattern and the upper electrode, wherein the first spacer covers a side surface of the upper metal pattern.

6. The device as claimed in claim 1, further comprising a lower metal pattern between the variable resistance pattern and the intermediate electrode.

7. The device as claimed in claim 6, wherein:
a width of the lower metal pattern is larger than a width of the variable resistance pattern at a bottom surface thereof, and
a bottom end of the second spacer is in contact with a portion of a top surface of the lower metal pattern that is not covered by the variable resistance pattern.

8. The device as claimed in claim 6, wherein:
a width of the lower metal pattern is equal to a width of the variable resistance pattern at a bottom surface thereof, and
the second spacer covers a side surface of the lower metal pattern.

9. The device as claimed in claim 1, wherein:
a distance between the memory cells ranges from 5 nm to 20 nm, and
a thickness of each of the first and second spacers ranges from 10 Å to 20 Å.

10. The device as claimed in claim 1, wherein the first spacer and the second spacer include a same material, and each include silicon oxide or silicon nitride.

11. The device as claimed in claim 1, further comprising a conductive polymer between the first spacer and the second spacer at the side surface of the upper electrode.

12. A variable resistance memory device, comprising:
memory cells two-dimensionally arranged on a substrate, and
an insulating layer filling a space between the memory cells,
wherein each of the memory cells includes:
a lower electrode;
a switching pattern on the lower electrode;
an intermediate electrode on the switching pattern;
a lower metal pattern on the intermediate electrode;
a variable resistance pattern on the lower metal pattern;
an upper electrode on the variable resistance pattern;
a second spacer covering a side surface of the upper electrode and a side surface of the variable resistance pattern; and
a first spacer between the upper electrode and the second spacer, the first spacer being in contact with a portion of a top surface of the variable resistance pattern protruding outwardly relative to the side surface of the upper electrode.

13. The device as claimed in claim 12, wherein the second spacer is in contact with the side surface of the variable resistance pattern.

14. The device as claimed in claim 12, wherein:
a width of the variable resistance pattern at the top surface thereof is larger than a width of the upper electrode, and
a width of a portion of the variable resistance pattern proximate to the upper electrode is greater than a width of a portion of the variable resistance pattern distal to the upper electrode.

15. The device as claimed in claim 12, further comprising an upper metal pattern between the variable resistance pattern and the upper electrode,
wherein the first spacer covers a side surface of the upper metal pattern.

16. The device as claimed in claim 12, wherein:
a width of the lower metal pattern is larger than a width of the variable resistance pattern at a bottom surface thereof, and
the second spacer extends along the side surface of the variable resistance pattern to have a bottom end that is in contact with a top surface of the lower metal pattern.

17. The device as claimed in claim 12, wherein the second spacer covers a side surface of the lower metal pattern.

* * * * *